(12) United States Patent
Katoh et al.

(10) Patent No.: US 8,159,282 B2
(45) Date of Patent: Apr. 17, 2012

(54) SEMICONDUCTOR INTEGRATED CIRCUIT AND HIGH FREQUENCY MODULE WITH THE SAME

(75) Inventors: Kaoru Katoh, Mitaka (JP); Shigeki Koya, Koganei (JP); Shinichiro Takatani, Mitaka (JP); Yasushi Shigeno, Maebashi (JP); Akishige Nakajima, Higashiyamato (JP); Takashi Ogawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/615,525

(22) Filed: Nov. 10, 2009

(65) Prior Publication Data

US 2010/0117713 A1     May 13, 2010

(30) Foreign Application Priority Data

Nov. 10, 2008 (JP) ................................ 2008-287921

(51) Int. Cl.
*H03K 17/687* (2006.01)
(52) U.S. Cl. ......... 327/427; 327/434; 327/436; 333/103
(58) Field of Classification Search .................. 327/427, 327/430, 434, 436; 333/103
See application file for complete search history.

(56) References Cited

U.S. PATENT DOCUMENTS

| 5,878,331 | A | 3/1999 | Yamamoto et al. |
| 6,252,463 | B1 * | 6/2001 | Kobayashi ..................... 330/311 |
| 6,987,414 | B2 * | 1/2006 | Numata ........................ 327/365 |
| 7,263,337 | B2 * | 8/2007 | Struble ........................... 455/78 |

FOREIGN PATENT DOCUMENTS

| JP | 09-200021 A | 7/1997 |
| JP | 2006-173754 A | 6/2006 |
| WO | WO-2008/056747 A1 | 5/2008 |

OTHER PUBLICATIONS

U.S. Appl. No. 12/513,280.

* cited by examiner

*Primary Examiner* — Kenneth B. Wells
(74) *Attorney, Agent, or Firm* — Miles & Stockbridge P.C.

(57) ABSTRACT

The present invention is directed to reduce increase in the level of a harmonic signal of an RF (transmission) Tx output signal at the time of supplying an RF Tx signal to a bias generation circuit of an antenna switch. A semiconductor integrated circuit includes an antenna switch having a bias generation circuit, a Tx switch, and an antenna switch having a bias generation circuit, a transmitter switch, and a receiver (Rx) switch. The on/off state of a transistor of a Tx switch coupled between a Tx port and an I/O port is controlled by a Tx control bias. The on/off state of the transistors of the Rx switch coupled between the I/O port and a receiver (Rx) port is controlled by an RX control bias. A radio frequency (RF) signal input port of the bias generation circuit is coupled to the Tx port, and a negative DC output bias generated from a DC output port can be supplied to a gate control port of transistors of the Rx switch.

18 Claims, 12 Drawing Sheets

US 8,159,282 B2

SEMICONDUCTOR INTEGRATED CIRCUIT AND HIGH FREQUENCY MODULE WITH THE SAME

CLAIM OF PRIORITY

The present application claims priority from Japanese patent application JP 2008-287921 filed on Nov. 10, 2008, the content of which is hereby incorporated by reference into this application.

FIELD OF THE INVENTION

The present invention relates to a semiconductor integrated circuit including an antenna switch ANT-SW and a high frequency module using the same. More particularly, the invention relates to a technique effective to reduce increase in a harmonic signal level of an RF Tx output signal at the time of supplying an RF Tx signal to a bias generation circuit of the antenna switch ANT-SW.

BACKGROUND OF THE INVENTION

Hitherto, an antenna switch ANT-SW using a PIN diode is generally used. In recent years, an FET (Field Effect Transistor), particularly, an HEMT (High Electron Mobility Transistor) of a heterojunction structure having low on resistance is used in an antenna switch ANT-SW. By using an FET, an antenna switch ANT-SW can be integrated as a monolithic microwave integrated circuit (MMIC).

In the case of using a depletion type FET having an n channel such as an HEMT device in an antenna switch ANT-SW, a high potential difference equal to or larger than a threshold bias is applied across the gate and the source of an FET to be turned on and, on the other hand, a low potential difference equal to or less than the threshold bias is applied across the gate and the source of an FET to be turned off.

Patent document 1 (Japanese Unexamined Patent Application Publication No. H09-200021) discloses a method of improving an insertion loss characteristic and an isolation characteristic of an antenna switch ANT-SW by supplying a low bias which is lower than a ground potential as a control signal of low bias applied at the time of transmission to the gate pole of a field effect transistor of a depletion type of a reception-side switch unit of the antenna switch ANT-SW.

FIGS. 13A and 13B are diagrams showing the antenna switch ANT-SW described in the patent document 1, a control circuit, and a negative bias generation circuit.

In FIG. 13B, an antenna switch ANT-SW 4a coupled to an antenna port 5 includes a transmission-side switch (Tx switch) 4b and a reception-side switch (Rx switch) 4c. A reception-side (Rx) input port 63 of the Rx switch 4c is connected to a reception-side attenuator 6. A control circuit 10a is coupled to a control signal input port 64 of the Tx switch 4b, a control signal input port 65 of the Rx switch 4c, and the reception-side attenuator 6, and a negative bias generation circuit 9 is coupled to the control circuit 10a. Therefore, at the time of transmission, a negative bias Vss generated from the negative bias generation circuit 9 is supplied to the gate pole of a field effect transistor 71 of the depletion type of the Rx switch 4c via an output buffer 18b of the control circuit 10a.

The negative bias generation circuit 9 shown in FIG. 13A includes an oscillator or an external input signal buffer 21, a drive circuit 22, a charge pump 23 that generates the negative bias Vss, and a level control circuit 24.

Patent document 2 (Japanese patent laid-open No. 2006-173754) discloses a method of improving the isolation characteristic and reducing power consumption in receiving operation and reception waiting operation by coupling a negative bias circuit to the gate of a depletion-type field effect transistor of a reception-side switch of an antenna switch ANT-SW. The negative bias circuit described in the patent document 2 includes an oscillator and a charge pump circuit.

Patent document 3 (WO 2008/056747) discloses a method of coupling a DC boost circuit to the gate of a field effect transistor (FET) of a Tx switch of an antenna switch ANT-SW and supplying a DC control bias and an RF signal to the DC boost circuit. With the configuration, a DC output bias larger than the DC control bias is generated from the DC boost circuit to drive the gate of the FET. By a large DC output bias, the on resistance of the FET of the Tx switch is reduced, and an RF signal loss is reduced. On the other hand, a gate to source bias of each of FETs of other switches becomes a deep reverse bias, so that a change in the gate capacitance of each FET can be reduced, and a harmonic distortion of the antenna switch ANT-SW can be reduced.

FIGS. 12A and 12B are diagrams showing the antenna switch ANT-SW and the DC boost circuit described in the patent document 3.

The DC boost circuit described in the patent document 3 is constructed as shown in FIG. 12B and operates as follows. When a coupling point 105 has a negative bias swing for the first time by an RF input signal RFin of an RF input terminal 101, a diode 108 is forwardly biased and enters a conduction state. On the other hand, a diode 109 is reversely biased and enters an unconduction state. At this time, current flows in a capacitance 106 via the diode 108, and the coupling point 105 side of the capacitance 106 is charged with negative bias. On the other hand, the side of the diodes 108 and 109 of the capacitance 106 is charged with positive bias. When the coupling point 105 has a positive bias swing, the diode 108 is reversely biased and enters an unconduction state. On the other hand, the diode 109 is forwardly biased and enters a conduction state. At this time, positive charges in the capacitance 106 flow in a capacitance 110 via the diode 109, one end of the capacitance 110 coupled to the cathode of the diode 109 is charged with positive bias. On the other hand, the other end of the capacitance 110 coupled to a DC control bias Vdc and the anode of the diode 108 is charged with negative bias. By repetition of the operation, the capacitance 110 is charged, and a boosted output bias Vout equal to the sum of the DC control bias Vdc applied to a DC control bias supply port 103 and a charge bias across both ends of the capacitance 110 is output from an output port 104 of a DC boost circuit and used for on/off control on the FET in the antenna switch ANT-SW.

Specifically, in the antenna switch ANT-SW shown in FIG. 12A, in a transmission (Tx) mode of a first RF transmission (Tx) signal Tx1, a first Tx DC control bias of the high level is supplied to a first Tx control port 310 of a first Tx switch 302. On the other hand, the first RF Tx signal Tx1 is applied to a first Tx port 306. Using a part of the first RF Tx signal Tx1, a capacitance 335 of a first DC boost circuit 330 is charged. Positive bias is applied from the capacitance 335 of the first DC boost circuit 330 to the gates of FETs 320A to 320D of the first Tx switch 302, and a gate to source bias of each of the FETs increases. Accordingly, the on resistance Ron of the FETs 320A to 320D controlled to be on in the first Tx switch 302 is reduced, and an RF signal loss in the Tx mode can be reduced. In the Tx mode of the first RF Tx signal Tx1, the second Tx DC control bias of the low level is supplied to a second Tx control port 311 of a second Tx switch 303, a first Rx DC control bias of the low level is supplied to a first Rx control port 312 of a first Rx switch 304, and a second Rx DC control bias of the low level is supplied to a second Rx control port 313 of a second Rx switch 305. Therefore, FETs 340A to 340D of the second Tx switch 303, FETs 360A to 360D of the first Rx switch 304, and FETs 370A to 370D of the second Rx switch 305 enter the off state.

In response to a DC boost output bias of the high level from the first DC boost circuit 330 of the first Tx switch 302, the bias of a common input/output port 301 of the antenna switch ANT-SW also becomes the high level. Therefore, the gate to source bias of each of the FETs 340A to 340D of the second Tx switch 303, the FETs 360A to 360D of the first Rx switch 304, and the FETs 370A to 370D of the second Rx switch 305 in the off state where the DC control bias of the low level is supplied to the gate becomes a deep reverse bias. As a result, a change in the gate capacitance of the FETs in the off state can be made small, and harmonic distortion of the antenna switch ANT-SW can be reduced.

SUMMARY OF THE INVENTION

As described in the patent document 3, by driving the gate of the FET of the Tx switch of the antenna switch ANT-SW by the boost output signal of the DC boost circuit, the on resistance of the FET of the Tx switch which is controlled to be on is reduced and, on the other hand, harmonic distortion of the FET of the RX switch which is controlled to be off can be reduced. Further, as described in the patent document 3, the DC control bias and the RF signal are supplied to the DC boost circuit and a DC output bias larger than the DC control bias can be generated from the DC boost circuit, so that an oscillator included in a negative bias generation circuit or a negative circuit as described in the patent document 1 or 2 can be omitted.

However, when the inventors of the present invention examined the antenna switch ANT-SW described in the patent document 3 in detail prior to the present invention, they found out a problem such that harmonic distortion increases abnormally immediately after switch to the Tx mode.

To find out the mechanism of occurrence of a problem of abnormal increase in the harmonic distortion immediately after switch to the Tx mode, the inventors herein first made a circuit analysis on the antenna switch ANT-SW.

FIG. 14 is a diagram showing the configuration of an antenna switch ANT-SW on which the mechanism of occurrence of a problem of abnormal increase in the harmonic distortion was found out prior to the present invention by the inventors herein.

In the right part of the antenna switch ANT-SW 300 shown in FIG. 14, the first Tx switch 302 similar to the first Tx switch 302 in the upper right part of the antenna switch ANT-SW 300 shown in FIGS. 12A and 12B is disposed. However, it is different from the first Tx switch 302 in FIGS. 12A and 12B with respect to the point that a capacitance 31 is inserted between the first Tx port 306 and the FETs 320A to 320D in the first Tx switch 302 in FIG. 14. The capacitance 31 functions as a DC cut capacitance for preventing the source to drain DC bias of the FETs 320A to 320D of the first Tx switch 302 from being applied to a transmission (Tx) circuit coupled to the first Tx port 306. The capacitance 31 also functions as an AC coupling capacitance for supplying an RF Tx signal from the Tx circuit coupled to the first Tx port 306 to the first Tx switch 302.

In the left part of the antenna switch ANT-SW 300 shown in FIG. 14, the first Rx switch 304 similar to the first Rx switch 304 in the lower right part of the antenna switch ANT-SW 300 shown in FIGS. 12A and 12B is disposed. However, it is different from the first Rx switch 304 in FIG. 12A with respect to the point that a capacitance 32 is inserted between a first reception (Rx) port 308 and the FETs 360A to 360D in the first Rx switch 304 in FIG. 14. The capacitance 32 functions as a DC cut capacitance for preventing the source to drain DC bias of the FETs 362A to 362D of the first Rx switch 304 from being applied to a reception (Rx) circuit coupled to the first Rx port 308. The capacitance 32 also functions as an AC coupling capacitance for supplying an RF Rx signal received by an antenna ANT to the Rx circuit coupled to the first Rx port 308 via the first Rx switch 304.

A capacitance 30 is coupled to the common I/O port 301 disposed in the upper center of the antenna switch ANT-SW 300 shown in FIG. 14. The capacitance 30 functions as a DC cut capacitance for preventing a DC bias of a common coupling node of the first Tx switch 302 and the first Rx switch 304 from being applied to the antenna ANT. The capacitance 30 also functions as an AC coupling capacitance between the antenna ANT and the first Tx switch 302 and the first RX switch 304. The capacitance value of each of the capacitances 30, 31, and 32 functioning as the DC cut capacitance and the AC coupling capacitance is set to a large capacitance value of 50 pF.

At the beginning of the Tx mode of the first RF Tx signal Tx1, supply of a first Tx DC control bias $V_{DC}$ of the high level to the first Tx control port 310 of the first Tx switch 302 starts. After that, supply of the first RF Tx signal to the first Tx port 306 of the first Tx switch 302 starts, the DC boosting operation in the first DC boost circuit 330 starts, and rise of a DC boost output bias $V_{BS}$ of the first DC boost circuit 330 starts.

However, it was made clear that, in the rise period of the DC boost output bias $V_{BS}$ of the first DC boost circuit 330 at the beginning of the Tx mode, the capacitances 30, 31, and 32 each of which is set to a large capacitance value are charged with the DC boost output bias $V_{BS}$, and the charge speed is low.

Specifically, the time constant of the charge speed of the capacitances 30, 31, and 32 is expressed by the following equation (1).

$$\tau 1 = \begin{pmatrix} C30 + C31 + C32 + C360A + \\ C360B + C360C + C360D + C331 + C335 \end{pmatrix} \times \quad \text{Equation (1)}$$

$$\begin{pmatrix} R321A + R321B + R321C + R321D + R322A + \\ R322B + R322C + R322D + R363 + R361A + \\ R361B + R361C + R361D + R332 + R336 \end{pmatrix}$$

$$= (50 + 50 + 50 + 0.2 + 0.2 + 0.2 + 0.2 + 0.5 + 0.5) \times$$

$$(10 + 10 + 10 + 10 + 10 + 10 + 10 + 5 + 5)$$

$$\approx 152 \text{ pF} \times 80 \text{ k}\Omega$$

$$= 12.2 \text{ }\mu\text{s}$$

That is, the DC boost output bias $V_{BS}$ from the first DC boost circuit 330 is supplied to the gates of the FETs 320A to 320D of the first Tx switch 302, and a gate shottky barrier of the FETs 320A to 320D is forwardly biased. When the DC boost output bias $V_{BS}$ of the first DC boost circuit 330 rises, the capacitance values C30, C31, and C32 of the capacitances 30, 31, and 32 are increased by the forward current of the gate shottky barrier of the FETs 320A to 320D of the first TX switch 302 via resistance element included in the equation (1). As a result, the charge speeds of the capacitance values C30, C31, and C32 of the capacitances 30, 31, and 32 become slow.

FIG. 15 is a diagram for explaining the operation of the antenna switch ANT-SW shown in FIG. 14 immediately after switch to the Tx mode.

The voltage $V_{COM}$ of the common coupling node between the first Tx switch 302 and the first Rx switch 304 of the antenna switch ANT-SW 300 shown in FIG. 14 reaches to an almost high level $V_{DC}$ at relatively high speed at a time point SWon when supply of the first Tx DC control bias $V_{DC}$ of the high level to the first Tx control port 310 of the first Tx switch 302 starts as shown in FIG. 15.

At a time point RFin after that, supply of the first RF Tx signal to the first Tx port 306 of the first Tx switch 302 starts, the DC boost operation in the first DC boost circuit 330 starts, and increase in the DC boost output bias $V_{BS}$ of the first DC boost circuit 330 starts. Therefore, the bias $V_{COM}$ of the common coupling node rises from the level of the first Tx DC control bias $V_{DC}$ at the first Tx control port 310 to the level of a sum bias $V_{DC}+V_{BS}$.

As a result, the on resistance Ron of the FETs 320A to 320D of the first Tx switch 302 of the antenna switch ANT-SW 300 is sufficiently reduced and, as shown in FIG. 15, the RF Tx output signal Pout to be supplied to the antenna ANT coupled to the common I/O port 301 starts increasing.

FIG. 16 is a diagram showing a change in the gate to source bias Vgs(Rx) and a change in the gate to source capacitance Cgs(Rx) of the FETs 360A to 360D of the first Rx switch 304 immediately after start of supply of the first RF Tx signal to the first Tx port 306 in a state where the first Tx DC control bias $V_{DC}$ is supplied to the first Tx control port 310 of the first Tx switch 302 in the antenna switch ANT-SW illustrated in FIG. 14.

In the case where the DC boost output bias $V_{BS}$ of the first DC boost circuit 330 sufficiently rises after lapse of sufficient time since start of the supply of the first RF Tx signal to the first Tx port 306, the gate to source bias Vgs (Rx) of the FETs 360A to 360D of the first Rx switch 304 becomes a deep reverse bias of about −4.5 volts. Therefore, the capacitance value of the gate to source capacitance Cgs (Rx) of the FETs 360A to 360D of the first Rx switch 304 is a sufficiently small value, and a harmonic distortion of the antenna switch ANT-SW can be reduced.

However, in the case where sufficient time has not elapsed since start of the supply of the first RF Tx signal to the first Tx port 306 and the DC boost output bias $V_{BS}$ of the first DC boost circuit 330 has not sufficiently increased, the gate to source bias Vgs (Rx) of the FETs 360A to 360D of the first Rx switch 304 becomes a shallow reverse bias of about −2.5 volts. A positive peak value of the first RF Tx signal supplied to the first Tx port 306 multiplexed on the shallow reverse bias of about −2.5 volts reaches the gate to source threshold bias −Vth of the FETs 360A to 360D or higher. Therefore, a number of electrons as carriers are accumulated in the channel region just below the gates of the FETs 360A to 360D, so that the capacitance value of the gate to source capacitance Cgs (Rx) of the FETs 360A to 360D sharply increases. At this time, the capacitance value of the gate to drain capacitance Cgd(Rx) of the FETs 360A to 360D similarly sharply increases. As a result, a part of the first RF Tx signals supplied to the first Tx port 306 flows in the Rx circuit coupled to the first Rx port 308 via the gate to source capacitance Cgs (Rx) and the gate to drain capacitance Cgd(Rx) of large capacitance values of the FETs 360A to 360D of the first Rx switch 304 of the antenna switch ANT-SW 300.

FIG. 17 is a diagram showing a change in the harmonic signal RFout of the RF Tx output signal Pout supplied to the antenna ANT immediately after start of supply of the first RF Tx signal to the first Tx port 306 in a state where the first Tx DC control bias $V_{DC}$ is supplied to the first Tx control port 310 of the first Tx switch 302 in the antenna switch ANT-SW illustrated in FIG. 14.

As shown in FIG. 17, the level of the harmonic signal RFout of the RF Tx output signal Pout markedly increases immediately after supply of the first RF Tx signal to the first Tx port 306 of the first Tx switch 302 starts at the time point RFin. The harmonic signal of the high level causes a problem such that it disturbs other wireless systems.

The present invention has been achieved as a result of examinations of the inventors of the present invention prior to the present invention as described above.

An object of the present invention is therefore to reduce increase in the level of a harmonic signal of an RF Tx output signal at the time of supplying the RF Tx signal to a bias generation circuit of an antenna switch ANT-SW.

The above and other objects and novel features of the present invention will become apparent from the description of the specification and the appended drawings.

Representative ones of inventions disclosed in the application will be described briefly as follows.

A representative invention relates to a semiconductor integrated circuit (200) including at least one antenna switch ANT-SW having a bias generation circuit (100), a transmitter (Tx) switch 101, and a receiver (Rx) switch 102.

The on/off state of a Tx field effect transistor (211) of the Tx switch (101) coupled between a Tx port (203) and an I/O port (201) can be controlled by a Tx control bias (V_Txc).

The on/off state of the Rx field effect transistors (215a to 215d) of the Rx switch (102) coupled between the I/O port (201) and a receiver (Rx) port (205) is controlled by an RX control bias (V_Rxc).

A radio frequency (RF) signal input port (10) of the bias generation circuit (100) is coupled to the Tx port (203), and a negative DC output bias generated from a DC output port (104) can be supplied to a gate control port of the Rx field effect transistors (215a to 215d) of the Rx switch (102) (refer to FIGS. 1 and 2).

Effects obtained by the representative ones of the inventions disclosed in the application will be briefly described as follows.

That is, at the time of supplying the RF Tx signal to the bias generation circuit of the antenna switch ANT-SW, increase in the level of a harmonic signal of an RF Tx output signal can be reduced.

DETAILED DESCRIPTION OF THE PREFERRED EMBODIMENTS

<<Representative Embodiments>>

Figure 1:
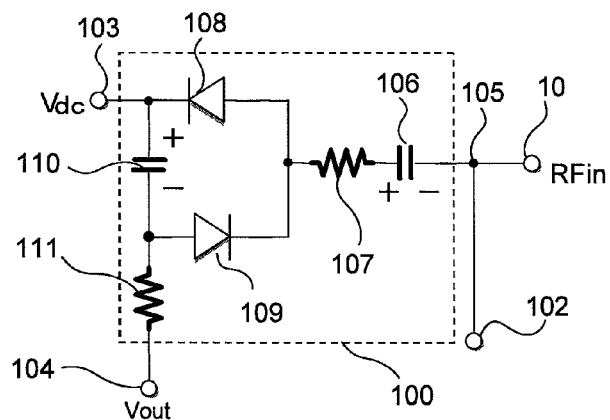
FIG. 1 is a diagram showing the configuration of a DC boost circuit provided in a semiconductor integrated circuit according to an embodiment of the present invention.

First, outline of representative embodiments of the present invention disclosed in the application will be described. Reference numerals of the drawings referred to in parentheses in the description of the outline of the representative embodiments merely illustrate components designated with the reference numerals included in the concept of the components.

(1) A representative embodiment relates to a semiconductor integrated circuit (200) including at least one antenna switch ANT-SW having a bias generation circuit (100), a transmitter (Tx) switch 101, and a receiver (Rx) switch 102.

The Tx switch (101) is coupled between a transmitter (Tx) port (203) and an I/O port (201), and an on/off state of a Tx field effect transistor (211) of the Tx switch (101) can be controlled according to level of a Tx control bias (V_Txc) supplied to the Tx control port (202).

The Rx switch (102) is coupled between the I/O port (201) and a receiver (Rx) port (205), an on/off state of the Rx field effect transistors (215a to 215d) of the Rx switch (102) can be controlled according to the level of an RX control bias (V_Rxc) supplied to an Rx control port (204).

Figure 2:
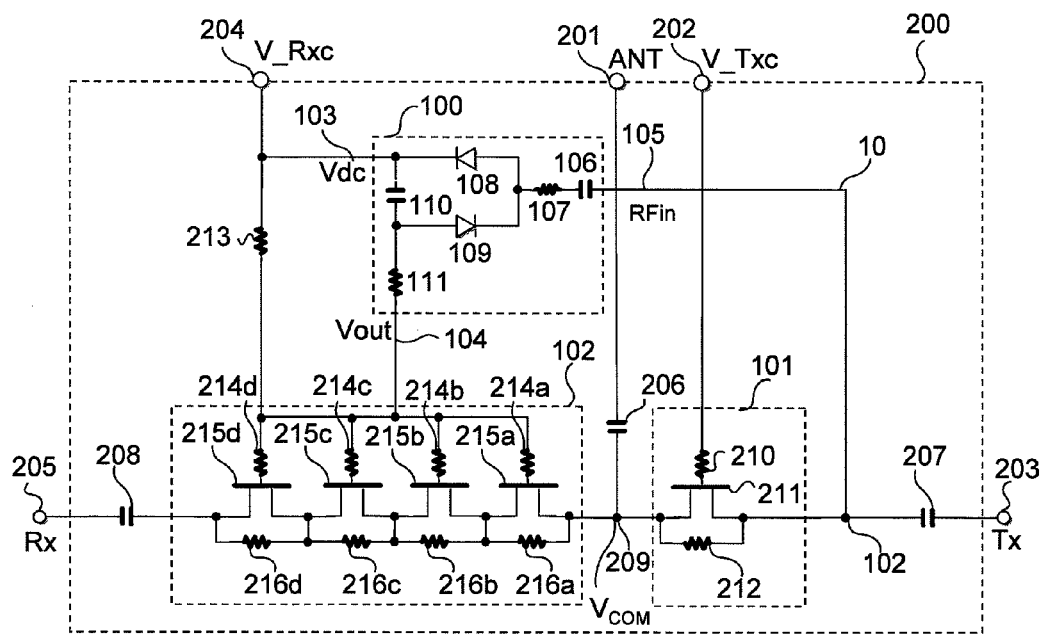
FIG. 2 is a diagram showing the configuration of a DC boost circuit, a Tx switch, and an RX switch provided in a semiconductor integrated circuit according to an embodiment of the invention.

A radio frequency (RF) signal input port (10) of the bias generation circuit (100) is coupled to the Tx port (203) of the Tx switch (101), and a negative DC output bias generated from a DC output port (104) of the bias generation circuit (100) can be supplied to a gate control port of the Rx field effect transistors (215a to 215d) of the Rx switch (102) (refer to FIGS. 1 and 2).

According to the embodiment, when the negative DC output bias generated from the DC output port (104) of the bias generation circuit (100) in response to start of supply of the RF Tx input signal (Tx) to the Tx port (203), forward current does not flow in the gate control ports of the Rx field effect transistors (215a to 215d) of the Rx switch (102).

In a preferred embodiment, each of the Tx field effect transistor (211) of the Tx switch (101) and the Rx field effect transistors (215a to 215d) of the Rx switch (102) is an n-channel device.

In response to supply of the Tx control bias (V_Txc) of the high level to the Tx control port (202), the Tx field effect transistor (211) of the Tx switch (101) is controlled to be on.

In response to supply of the Rx control bias (V_Rxc) of the high level to the Rx control port (204), the Rx field effect transistors (215a to 215d) of the Rx switch (102) are controlled to be on (refer to FIG. 2).

In another preferred embodiment, in a Tx mode of transmitting an RF Tx input signal (Tx) supplied to the Tx port (203) to the I/O port (201), the Tx control bias (V_Txc) of the high level is supplied to the Tx control port (202), and the Rx control bias (V_Rxc) of the low level is supplied to the Rx control port (204).

In the Tx mode, a negative DC output bias generated from the DC output port (104) of the bias generation circuit (100) is supplied to a gate control port of the Rx field effect transistors (215a to 215d) of the Rx switch (102) in response to the RF Tx input signal (Tx) supplied to the Tx port (203) (refer to FIGS. 1 and 2).

In the other preferred embodiment, with the negative DC output bias generated from the DC output port (104) of the bias generation circuit (100), the gate and the source of the Rx field effect transistors (215a to 215d) of the Rx switch (102) are reversely biased, isolation of the Rx switch (102) can be improved.

In further another preferred embodiment, a DC control bias supply port (103) of the bias generation circuit (100) is coupled to the Rx control port (204).

In the Tx mode, the Rx control bias (V_Rxc) of the low level supplied to the Rx control port (204) is supplied to the DC control bias supply port (103) of the bias generation circuit (100) (refer to FIGS. 1 and 2).

In a more preferred embodiment, the Rx field effect transistor of the Rx switch (102) is constructed by a plurality of field effect transistors (215a to 215d) in which a drain-source path is coupled in series between the I/O port (201) and the Rx port (205) (refer to FIG. 2).

In further more preferred embodiment, each of the Rx field effect transistors (215a to 215d) of the Rx switch (102) and the Tx field effect transistor (211) of the Tx switch (101) is an HEMT having a heterojunction (refer to FIG. 2).

In a concrete embodiment, the antenna switch ANT-SW includes a first antenna switch ANT-SW (281) that controls transmission of a first RF signal of a first frequency band (f1), and a second antenna switch ANT-SW (282) that controls transmission of a second RF signal of a second frequency band (f2).

First and second ports of a diplexer (283) are coupled to the I/O port (285) of the first antenna switch ANT-SW (281) and the I/O port (286) of the second antenna switch ANT-SW (282), respectively.

Figure 6:
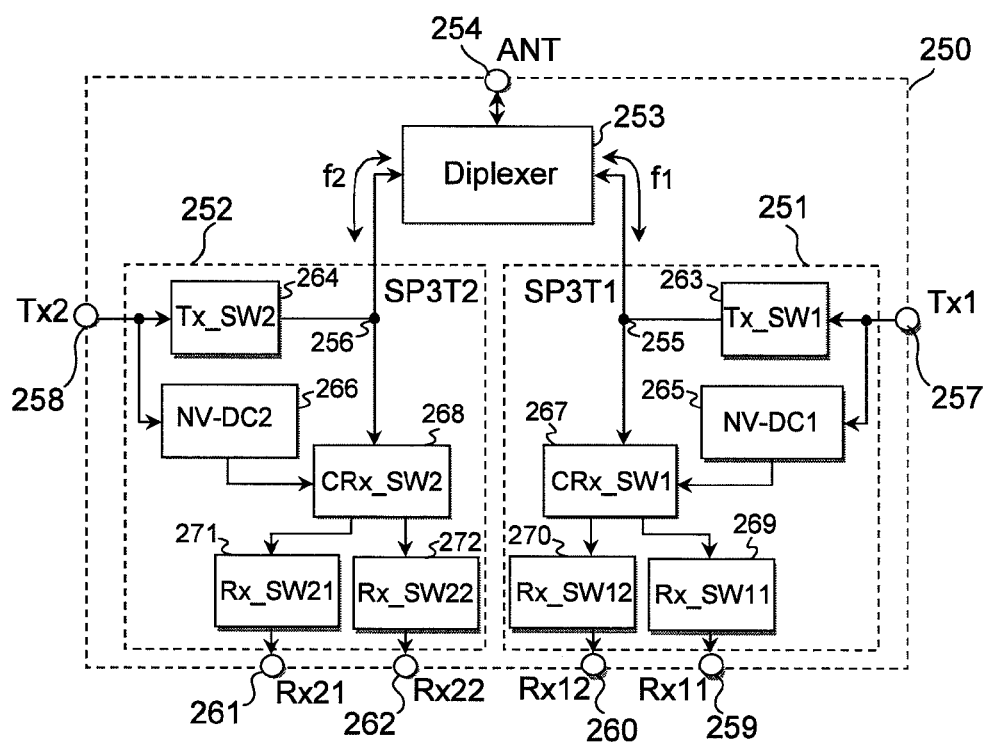
FIG. 6 is a diagram showing the configuration of a first SP3T-type antenna switch ANT-SW, a second SP3T-type antenna switch ANT-SW, and a diplexer provided in a semiconductor integrated circuit capable of processing a number of RF signals according to another embodiment of the invention.

An antenna (ANT) can be coupled to a common I/O port (284) of the diplexer (283) (refer to FIG. 6).

In another concrete embodiment, the Tx switch (705) of the first antenna switch ANT-SW (SPDT1) includes a single first Tx field effect transistor (762) coupled between the Tx port (709) of the first antenna switch ANT-SW (SPDT1) and the I/O port (701).

Figure 7:
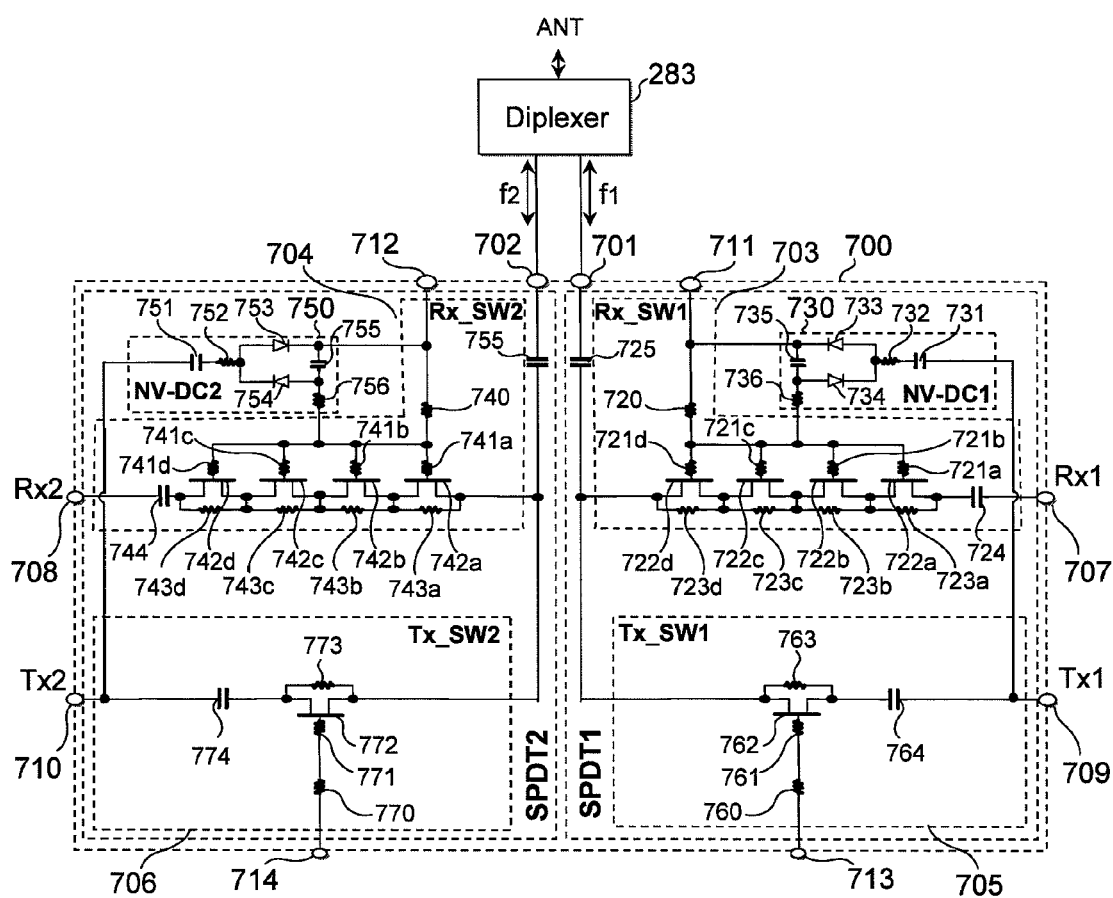
FIG. 7 is a diagram showing the configuration of a monolithic microwave integrated circuit MMIC capable of processing a plurality of RF signals and having therein a first SPDT-type antenna switch ANT-SW and a second SPDT-type antenna switch ANT-SW according to another embodiment of the invention.

The Tx switch (706) of the second antenna switch ANT-SW (SPDT2) includes a single second Tx field effect transistor (772) coupled between the Tx port (710) of the second antenna switch ANT-SW (SPDT2) and the I/O port (702) (refer to FIG. 7).

In the most concrete embodiment, a bias generation circuit (100) of each of the bias generation circuit (730) of the first antenna switch ANT-SW (SPDT1) and the bias generation circuit (750) of the second antenna switch ANT-SW (SPDT2) includes a first diode (108), a second diode (109), a first resistance (107), a second resistance (111), a first capacitance (106), and a second capacitance (107).

In each of the bias generation circuits (100), one of ports of serial coupling between the first resistance (107) and the first capacitance (106) is coupled to the RF signal input port (10), an anode of the first diode (108) and a cathode of the second diode (109) are coupled to the other port of the serial coupling.

The cathode of the first diode (108) and one port of the second capacitance (110) are coupled to the DC control bias supply port (103), and the anode of the second diode (109) and the other port of the second capacitance (110) are coupled to the DC output port (104) via the second resistance (111) (refer to FIGS. 1 and 2).

(2) A representative embodiment of another aspect of the present invention relates to a high frequency module (RF_ML) including a high power amplifier HPA (PA_ML) and an antenna switch ANT-SW semiconductor integrated circuit (ANT_SW).

The high power amplifier HPA (PA_ML) amplifies an RF transmission (Tx) signal (HB_Tx, LB_Tx) generated from an RF analog signal processing semiconductor integrated circuit (RF_IC).

An RF Tx output signal (TX) generated from an output of the HPA (PA_ML) can be supplied to an antenna (ANT) via the ANT-SW semiconductor integrated circuit (ANT_SW).

Figure 10:
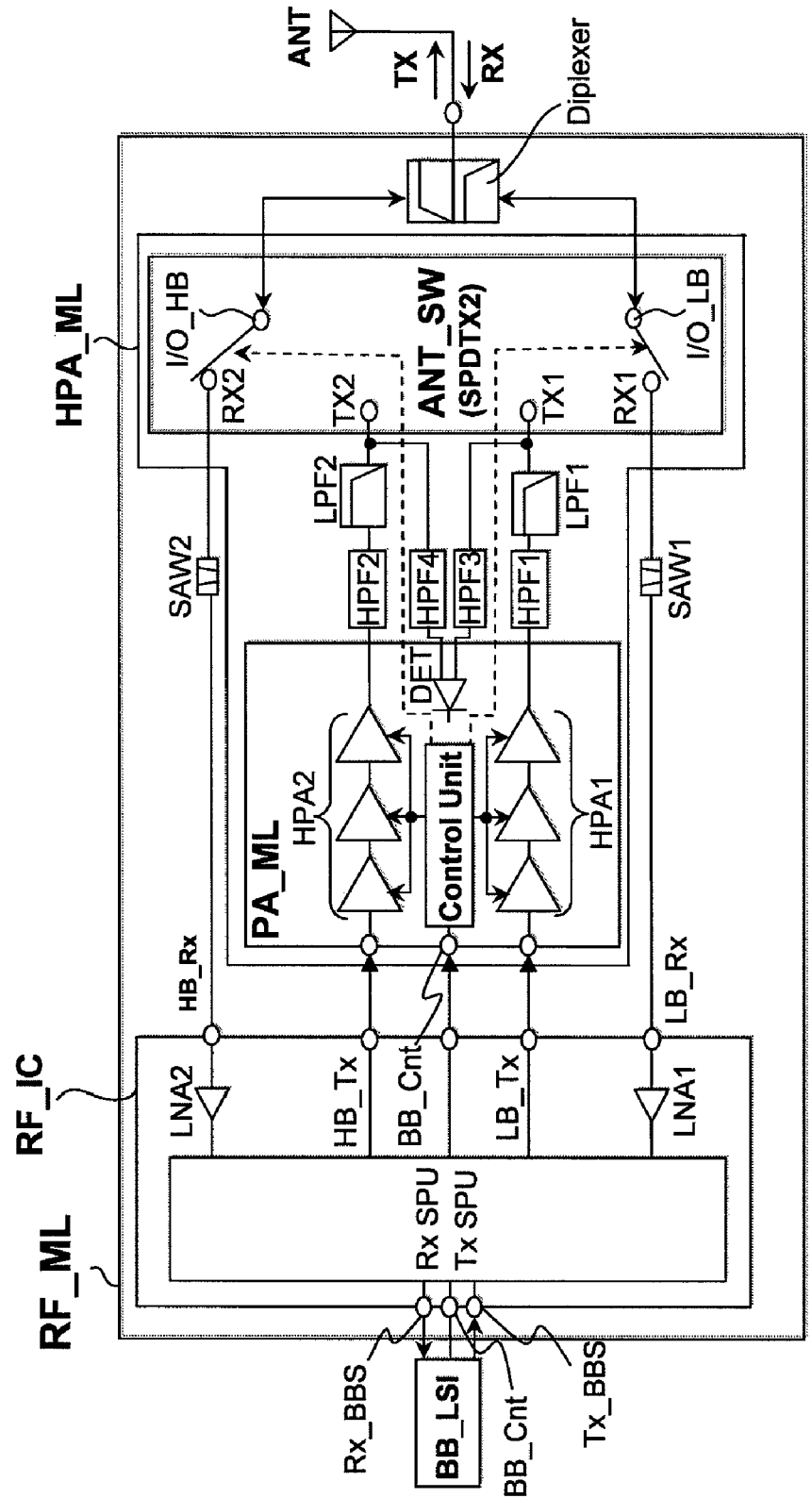
FIG. 10 is a diagram showing the configuration of an RF module including an antenna switch ANT-SW constructed in a monolithic microwave integrated circuit MMIC capable of processing a plurality of RF signals according to another embodiment of the invention.

An RF Rx signal (RX, HB_Rx, LB_Rx) received by the antenna (ANT) can be supplied to the radio frequency (RF) analog signal processing semiconductor integrated circuit (RF_IC) via the ANT-SW semiconductor integrated circuit (ANT_SW) (refer to FIG. 10).

The ANT-SW semiconductor integrated circuit (ANT_SW) includes at least one antenna switch ANT-SW having a bias generation circuit (100), a Tx switch (101), and an Rx switch (102).

The Tx switch (101) is coupled between a Tx port (203) and an I/O port (201), and an on/off state of a Tx field effect transistor (211) of the Tx switch (101) can be controlled according to level of a Tx control bias (V_Txc) supplied to the Tx control port.

The Rx switch (102) is coupled between the I/O port (201) and a receiver (Rx) port (205), and an on/off state of the Rx field effect transistors (215a to 215d) of the Rx switch (102) can be controlled according to the level of an RX control bias (V_Rxc) supplied to an Rx control port (204).

A radio frequency (RF) signal input port (10) of the bias generation circuit (100) is coupled to the Tx port (203) of the Tx switch (101), and a negative DC output bias generated from a DC output port (104) of the bias generation circuit (100) can be supplied to a gate control port of the Rx field effect transistors (215a to 215d) of the Rx switch (102) (refer to FIGS. 1 and 2).

<<Description of the Preferred Embodiments>>

Embodiments will be described more specifically. In all of the drawings for explaining best modes for carrying out the present invention, the same reference numerals are designated to parts having the same functions as those in the above-described drawings, and their description will not be repeated.

<<DC Boost Circuit of Negative Bias Output>>

FIG. 1 is a diagram showing the configuration of a DC boost circuit 100 provided in a semiconductor integrated circuit according to an embodiment of the present invention.

As shown in the diagram, the DC boost circuit 100 includes capacitances 106 and 110, resistances 107, 111, and diodes 108 and 109. A part of an RF input signal RFin supplied to the RF signal input port 10 is rectified, and a negative DC output bias Vout is generated from the DC output port 104.

In the DC boost circuit 100 shown in FIG. 1, the capacitance 106 and the resistance 107 may be coupled in the order as shown in FIG. 1 or may be interchanged. Since the resistance 107 is set to be a sufficiently large value as compared with the input impedance of 50Ω of the antenna, the input impedance of the DC boost circuit 100 has a sufficiently high value as compared with 50Ω. Therefore, most of the RF input signal RFin input to the RF signal input port 10 flows in the RF signal input port 102 coupled to an FET as a switching element of the antenna switch ANT-SW, and only a part of power flows in the DC boost circuit 100.

The operation of the DC boost circuit 100 will be described as follows.

First, a state where the bias swing of the RF signal is negative at the coupling point 105 will be considered. The diode 108 is reversely biased and enters an unconduction state. On the other hand, the diode 109 is forwardly biased and enters a conduction state. At this time, current flows in the capacitance 106 via the diode 109, one port of the capacitance 106 coupled to the coupling point 105 is charged negatively, and the other port of the capacitance 106 coupled to the diodes 108 and 109 is charged positively. Next, a state where the bias swing of the RF signal becomes positive at the coupling point 105 will be considered. The diode 108 is forwardly biased and enters the conduction state. On the other hand, the diode 109 is reversely biased and enters the unconduction state. At this time, positive charges accumulated at the other port of the capacitance 106 flow in the capacitance 110 via the diode 108. One end of the capacitance 110 coupled to the diode 109 and the resistance 111 is charged with negative bias. The other end of the capacitance 110 coupled to the DC control bias supply port 103 and the diode 108 is charged with negative bias. The operation of charging the capacitance 106 in response to the negative bias swing of the RF signal and the operation of charging the capacitance 110 in response to the positive bias swing of the RF signal are repeated, and the capacitance 110 is charged. The output bias Vout equal to the sum of the DC control bias Vdc applied to the DC control bias supply port 103 and the potential difference $V_{BS}$ between both ends of the capacitance 110 is output from the output port 104 of the DC boost circuit 100 and used for control on the FET as a switch element of the antenna switch ANT-SW. In the transmission (Tx) mode, the DC control bias Vdc of the DC control bias supply port 103 is zero volt, and the potential difference VBS between both ports of the capacitance 110 is negative bias, so that the output bias Vout of the output port 104 of the DC boost circuit 100 is negative bias. In the Tx mode, the negative bias Vout is applied to the gate of the FET as a reception Rx switch of the antenna switch ANT-SW.

<<RF Switch Driven by Negative Bias DC Boost Circuit>>

FIG. 2 is a diagram showing the configuration of the DC boost circuit 100, the Tx switch 101, and the RX switch 102 provided in a semiconductor integrated circuit 200 according to an embodiment of the invention. The semiconductor integrated circuit 200 is constructed as a monolithic microwave integrated circuit (MMIC) as a component of the antenna switch ANT-SW.

The DC boost circuit 100 built in the semiconductor integrated circuit 200 of FIG. 2 is substantially the same as the DC boost circuit 100 shown in FIG. 1. Also in the DC boost circuit 100 built in the semiconductor integrated circuit 200 of FIG. 2, an RF Tx input signal Tx is supplied from an RF signal external input port 203 to the RF signal input port 10 via a capacitance 207. To the DC control bias supply port 103 of the DC boost circuit 100 built in the semiconductor integrated circuit 200 of FIG. 2, an Rx DC control bias V_Rxc from an Rx DC control bias supply port 204 is supplied as the DC control bias Vdc.

The negative DC output bias Vout generated from the DC output port 104 of the DC boost circuit 100 built in the semiconductor integrated circuit 200 of FIG. 2 is supplied to the gates of a plurality of FETs 215a to 215d of the Rx switch 102 via resistances 214a to 214d, respectively. Each of the plurality of FETs 215a to 215d of the Rx switch 102 is a field effect transistor (FET) of an n-channel depletion-type high electron mobility transistor (HEMT). Resistances 216a to 216d are coupled as shown in FIG. 2 between the drains and the sources of the plurality of FETs 215a to 215d of the Rx switch 102.

The gates of the plurality of FETs 215a to 215d of the Rx switch 102 are coupled to an Rx Dc control bias supply port 204 via a resistance 213. One port 209 of the Rx switch 102 is coupled to a common I/O port 201 of the antenna switch ANT-SW via a capacitance 206. The other port of the Rx switch 102 is coupled to an Rx port 205 via a capacitance 208. The capacitance 208 functions as a DC cut capacitance for preventing the negative output bias Vout from the DC boost circuit 100 from being applied to the Rx circuit coupled to the Rx port 205. Further, the capacitance 208 functions as an AC coupling capacitance for supplying the RF Rx signal received by the antenna ANT coupled to the I/O port 201 to the Rx circuit coupled to the Rx port 205 via the Rx switch 102.

The Tx switch 101 includes an FET 211 constructed as an n-channel depletion-type HEMT. The gate of the FET 211 of the Tx switch 101 is coupled to a Tx DC control bias supply port 202 via a resistance 210. The one port 209 of the Tx switch 101 is coupled to the common I/O port 201 of the antenna switch ANT-SW via the capacitance 206. The other port of the Tx switch 101 is coupled to the Tx port 203 via the capacitance 207. The capacitance 207 functions as a DC cut capacitance for preventing a Tx circuit coupled to the Tx port 203 from being influenced by the high-level Tx DC control bias V_Txc supplied to the Tx DC control bias supply port 202 of the Tx switch 101. Further, the capacitance 207 functions as an AC coupling capacitance for supplying an RF Tx signal from the TX circuit coupled to the Tx port 203.

The capacitance 206 is coupled to the common I/O port 201 disposed in the upper center of the semiconductor integrated circuit 200 shown in FIG. 2. The capacitance 206 functions as a DC cut capacitance for preventing the antenna ANT from being influenced by the Tx DC control bias supplied to the Tx DC control bias supply port 202 of the Tx switch 101. Further, the capacitance 206 functions as an AC coupling capacitance between the antenna ANT and the Tx switch 101 and the Rx switch 102. The capacitance value of each of the capacitances 206, 207, and 208 functioning as the DC cut capacitance and the AC coupling capacitance is set to a large capacitance value of 50 pF.

The semiconductor integrated circuit 200 shown in FIG. 2 is a component of an antenna switch ANT-SW of a single-pole double-throw (SPDT) type.

In the field of the antenna switch ANT-SW, the common I/O port to which an antenna is coupled is called a single pole, and the Rx port coupled to the Rx circuit and the Tx port coupled to the Tx circuit are called throws. Therefore, since the antenna switch ANT-SW of FIG. 2 has two transmission/reception (Tx/Rx) ports of the Rx port 205 and the Tx port 203, it is called double throw.

The semiconductor integrated circuit 200 of FIG. 2 is constructed by a compound semiconductor chip made of GaAS or the like. Each of the plurality of FETs 215a to 215d of the Rx switch 102 and the FET 211 of the Tx switch 101 is an HEMT transistor. As it is well known, an HEMT transistor is a field effect transistor using two-dimensional electron gas formed on the heterojunction interface near the gate as a channel layer. A number of capacitances included in the semiconductor integrated circuit 200 of FIG. 2 can be formed by an MIM (metal-insulator-metal) capacitor on the surface of a compound semiconductor chip. Further, a number of resistances included in the semiconductor integrated circuit 200 of FIG. 2 can be formed by mesa resistances on the surface of a compound semiconductor chip.

<<Reception (Rx) Mode of SPDT-Type Antenna Switch ANT-SW>>

The operation in the Rx mode of the monolithic microwave integrated circuit (MMIC) 200 of the SPDT-type antenna switch ANT-SW shown in FIG. 2 is as follows.

In the Rx mode, the Tx DC control bias V_Txc supplied to the Tx DC control bias supply port 202 of the Tx switch 101 is set to zero volt of the low level. The Rx DC control bias V_Rxc supplied to the Rx DC control bias supply port 204 of the Rx switch 102 becomes three volts of the high level. Therefore, the FET 211 of the Tx switch 101 coupled between the Tx port 203 and the common I/O node 209 is controlled to be off. On the other hand, the FETs 215a to 215d of the Rx switch 102 coupled between the Rx port 205 and the common I/O node 209 are controlled to be on.

The RF Rx signal received by the antenna coupled to the common I/O port 201 via the FETs 215a to 215d controlled to be on by the Rx switch 102 is enabled to be supplied to the Rx circuit coupled to the Rx port 205. Since the FET 211 of the Tx switch 101 is controlled to be off at this time, the RF Tx signal as an output of the Tx circuit coupled to the Tx port 203 is made impossible to be supplied to the antenna coupled to the common I/O port 201.

By turning on the FETs 215a to 215d of the Rx switch 102 with the Rx DC control bias V_Rxc of the high level of three volts of the Rx DC control bias supply port 204, the bias $V_{COM}$ at the common I/O node 209 is also set to the high level. For example, when the threshold bias Vth across the gate and the source of the FETs 215a to 215d of the Rx switch 102 is −0.5 volt, the bias $V_{COM}$ of the common I/O node 209 becomes the high level of 2.5 volts. Since the Tx DC control bias V_Txc of zero volt of the low level of the Tx DC control bias supply port 202 is supplied to the gate of the FET 211 of the Tx switch 101 at this time, the FET 211 is reversely biased, and the isolation characteristic of the FET 211 of the Tx switch 101 is improved.

<<Transmission (Tx) Mode of SPDT-Type Antenna Switch ANT-SW>>

The operation in the Tx mode of the monolithic microwave integrated circuit (MMIC) 200 of the SPDT-type antenna switch ANT-SW shown in FIG. 2 is as follows.

In the Tx mode, the Tx DC control bias V_Txc supplied to the Tx DC control bias supply port 202 of the Tx switch 101 is set to three volts of the high level. The Rx DC control bias V_Rxc supplied to the Rx DC control bias supply port 204 of the Rx switch 102 becomes zero volt of the low level. Therefore, the FET 211 of the Tx switch 101 coupled between the Tx port 203 and the common I/O node 209 is controlled to be on. On the other hand, the FETs 215a to 215d of the Rx switch 102 coupled between the Rx port 205 and the common I/O node 209 are controlled to be off.

The RF Tx signal as an output of the Tx circuit coupled to the Tx port 203 is enabled to be supplied to the antenna coupled to the common I/O port 201 via the FET 211 controlled to be on by the Tx switch 101. Since the FETs 215a to 215d of the Rx switch 102 are controlled to be off at this time, the RF Rx signal received by the antenna coupled to the common I/O port 201 is made impossible to be supplied to the Rx circuit coupled to the Rx port 205.

By turning on the FET 211 of the Tx switch 101 with the Tx DC control bias V_Txc of the high level of three volts of the Tx DC control bias supply port 202, the bias $V_{COM}$ at the common I/O node 209 is also set to the high level. For example, when the threshold bias Vth across the gate and the source of the FET 211 of the Tx switch 101 is −0.5 volt, the bias $V_{COM}$ of the common I/O node 209 becomes the high level of 2.5 volts. Since the Rx DC control bias V_Rxc of zero volt of the low level of the Rx DC control bias supply port 204 is supplied to the gates of the FETs 215a to 215d of the Rx switch 102 at this time, the FETs 215a to 215d are reversely biased, and the isolation characteristic of the FETs 215a to 215d of the Rx switch 102 is improved.

Further, in response to the RF Tx input signal Tx as an output of the Tx circuit supplied to the Tx port 203, the negative output bias Vout is generated from the output port 104 of the DC boost circuit 100. The negative output bias Vout is supplied to the gates of the FETs 215a to 215d of the Rx switch 102. The reverse bias of the FETs 215a to 215d of the Rx switch 102 is increased, and the isolation characteristic of the FETs 215a to 215d of the Rx switch 102 is further improved.

A change speed of the negative output bias Vout from the output port 104 of the DC boost circuit 100 in response to start of supply of the RF Tx input signal Tx of the Tx circuit to the Tx port 203 is relatively high for the following reason.

Specifically, when the negative output bias Vout of the output port 104 of the DC boost circuit 100 drops, a gate shottky barrier of the FETs 215a to 215d constructed by n-channel depletion-type HEMTs is reversely biased in the Rx switch 102. Therefore, when the negative output bias Vout of the output port 104 of the DC boost circuit 100 of FIG. 2 decreases, the gate bias of the FETs 215a to 215d also decreases at high speed so as to follow the decrease in the negative output bias Vout of the output port 104.

Figure 3:
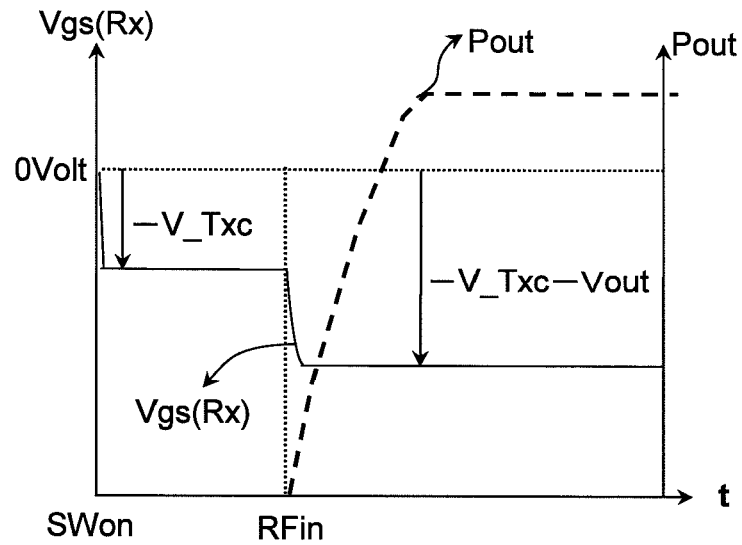
FIG. 3 is a diagram for explaining the operation of a monolithic microwave integrated circuit MMIC of an antenna switch ANT-SW of the SPDT type shown in FIG. 2 at the time of switch to the Tx mode.

FIG. 3 is a diagram for explaining the operation of the monolithic microwave integrated circuit (MMIC) 200 of the antenna switch ANT-SW of the SPDT type shown in FIG. 2 at the time of switch to the Tx mode.

As shown in FIG. 3, the bias $V_{COM}$ of the common I/O node 209 becomes a level of about 2.5 volts close to the level of the control bias V_Txc at the time point SWon when supply of the Tx DC control bias V_Txc of the high level of three volts of the Tx DC control bias supply port 202 of the Tx switch 101 starts. At this time, the Rx DC control bias V_Rxc of zero volt of the low level of the Rx DC control bias supply port 204 is supplied to the gates of the FETs 215a to 215d of the Rx switch 102. Therefore, the gate to source bias Vgs (Rx) of the FETs 215a to 215d of the Rx switch 102 is reversely biased according to the negative bias level of about −V_Txc.

Figure 14:
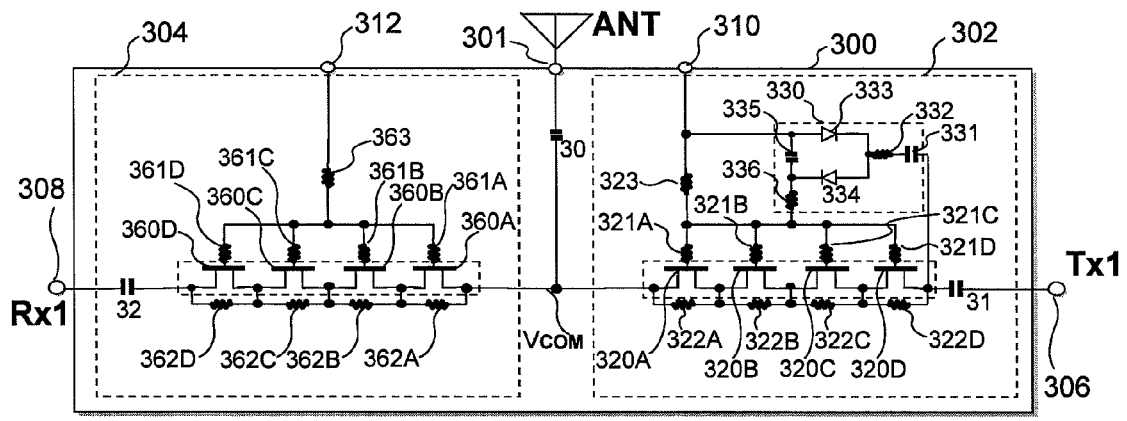
FIG. 14 is a diagram showing the configuration of an antenna switch ANT-SW on which the mechanism of occurrence of a problem of abnormal increase in a harmonic distortion was found out prior to the present invention by the inventors herein.
Figure 15:
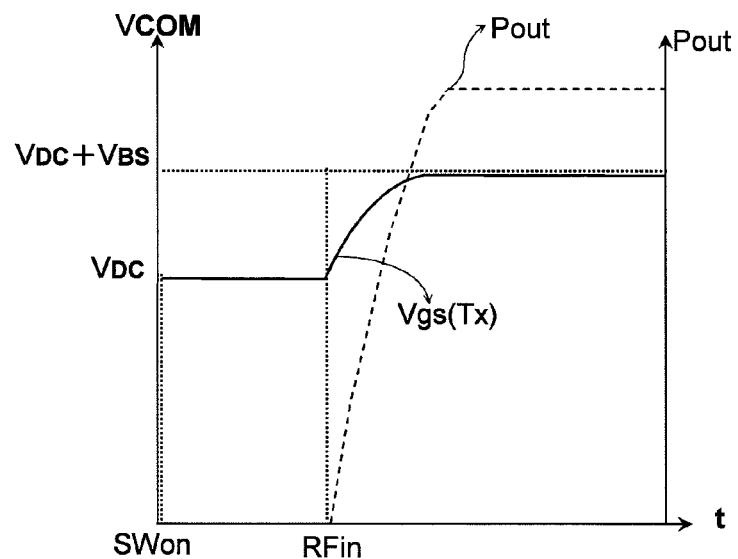
FIG. 15 is a diagram for explaining the operation of an antenna switch ANT-SW shown in FIG. 14 immediately after switch to a Tx mode.
Figure 16:
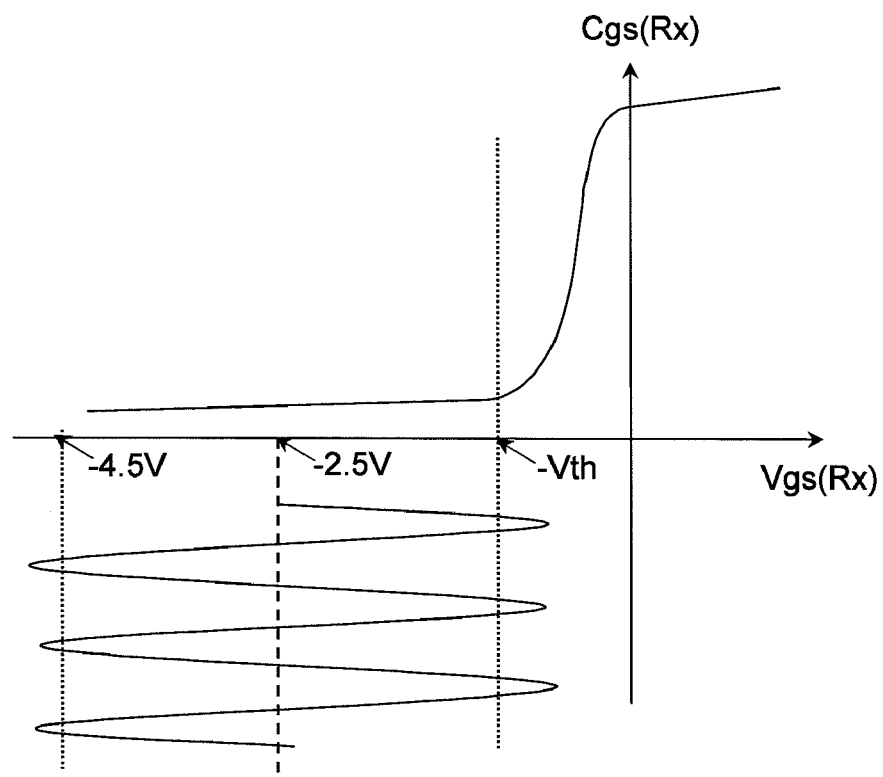
FIG. 16 is a diagram showing a change in a gate to source bias and a change in a gate to source capacitance of an FET of a first Rx switch immediately after start of supply of a first RF Tx signal to a first Tx port in a state where a first Tx DC control bias is supplied to a first Tx control port of the first Tx switch in the antenna switch ANT-SW illustrated in FIG. 14.
Figure 17:
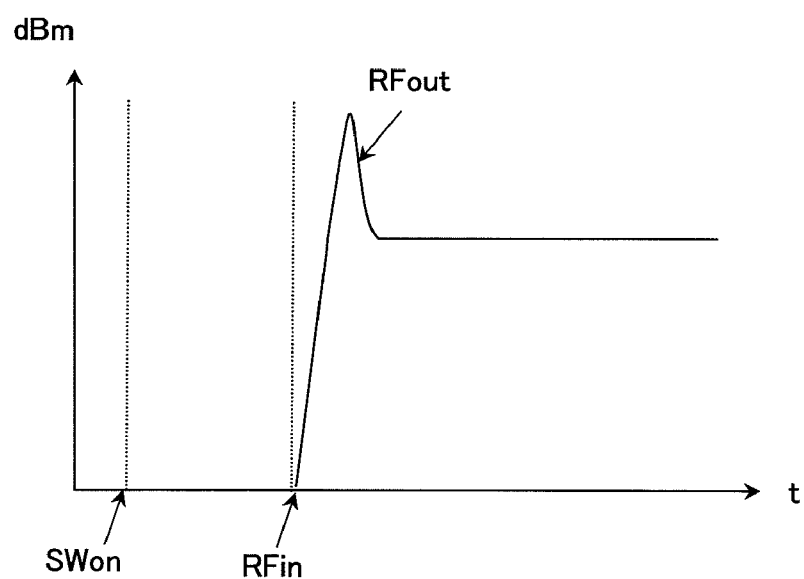
FIG. 17 is a diagram showing a change in the harmonic signal of an RF Tx output signal supplied to an antenna immediately after start of supply of a first RF Tx signal to a first Tx port in a state where a first Tx DC control bias is supplied to the first Tx control port of the first Tx switch in the antenna switch ANT-SW illustrated in FIG. 14.

At a time point RFin after that, in response to start of supply of the RF Tx input signal Tx to the Tx port 203, the negative output bias Vout from the output port 104 of the DC boost circuit 100 drops at high speed. Therefore, the gate to source bias Vgs(Rx) of the FETs 215a to 215d of the Rx switch 102 drops at high speed to the level of −V_Txc-Vout lower than the negative bias level of about −V_Txc. At this time, the gate shottky barrier of the FETs 215a to 215d of the Rx switch 102 is in a reverse bias state, and the large capacitance is not charged with the forward current of the gate shottky barrier of the FETs like in the antenna switch ANT-SW 300 of FIG. 14.

When the negative output bias Vout of the output port 104 of the DC boost circuit 100 decreases in the Tx mode of the MMIC 200 of the SPDT-type antenna switch ANT-SW shown in FIG. 2, the gate capacitance of the FETs 215a to 215d of the Rx switch 102 is only charged with the negative bias via the gate resistances 214a to 214d. Therefore, the time constant when the gate to source bias Vgs (Rx) of the FETs 215a to 215d of the Rx switch 102 becomes an extremely small value of about 0.12 μs.

Figure 4:
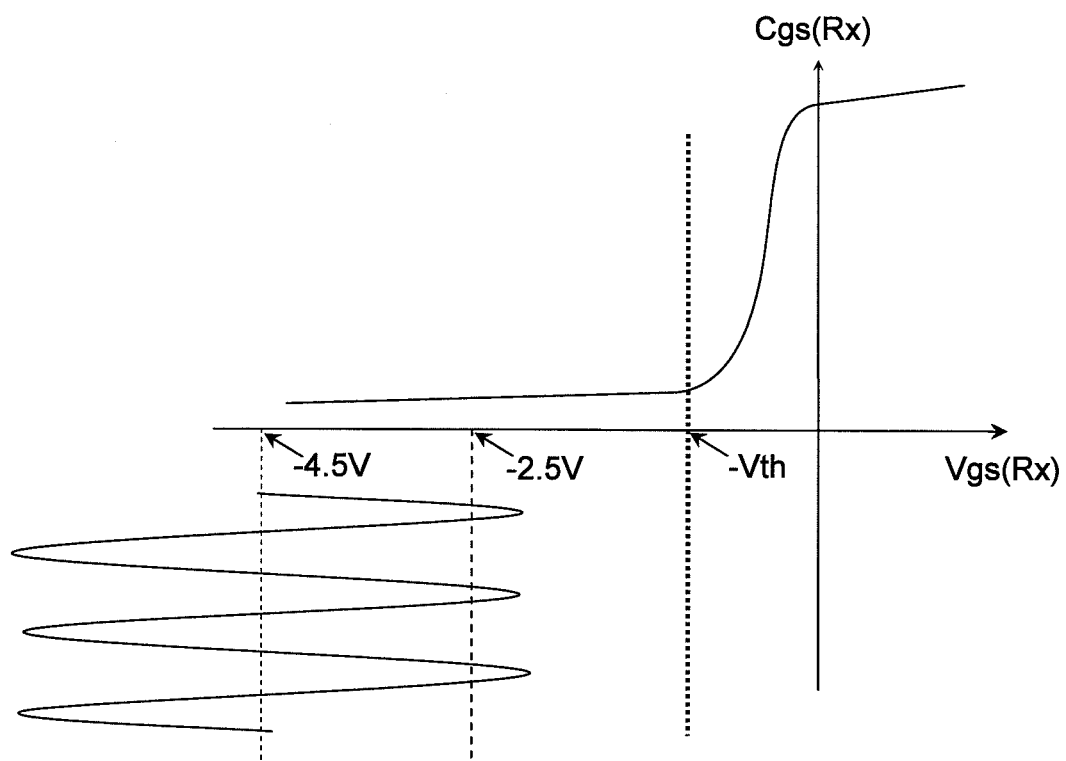
FIG. 4 is a diagram showing a change in a gate to source bias and a change in a gate to source capacitance of an FET of an RX switch at a time point after lapse of time corresponding to a time constant of about 0.12 μs in an MMIC 200 in the antenna switch ANT-SW of the SPDT type shown in FIG. 2.

FIG. 4 is a diagram showing a change in the gate to source bias Vgs(Rx) and a change in the gate to source capacitance Cgs(Rx) of the FETs 215a to 215d of the RX switch 102 at a time point after lapse of time corresponding to the time constant of about 0.12 μs in the MMIC 200 in the antenna switch ANT-SW of the SPDT type shown in FIG. 2.

At the time point after lapse of the time corresponding to the time constant of about 0.12 μs, the gate to source bias Vgs (Rx) of the FETs 215a to 215d of the Rx switch 102 is a deep reverse bias of about −4.5 volts lower than the shallow reverse bias of about −2.5 volts. A positive peak value of the RF Tx signal Tx supplied to the Tx port 203 multiplexed on the deep reverse bias of about −4.5 volts does not reach the gate to source threshold bias −Vth of the FETs 215a to 215d of the Rx switch 102. Therefore, a number of electrons as carriers are not accumulated in the channel range just below the gates of the FETs 215a to 215d, so that the capacitance value of the gate to source capacitance Cgs(Rx) of the FETs 215a to 215d does not sharply increase. At this time, the capacitance value of the gate to drain capacitance Cgd(Rx) of the FETs 215a to 215d similarly does not sharply increase. As a result, a part of the RF Tx signals Tx supplied to the Tx port 203 does not flow in the Rx circuit coupled to the Rx port 205 via the gate to source capacitance and the gate to drain capacitance of large capacitance values of the FETs 215a to 215d of the Rx switch 102 of the MMIC 200.

<<RF Switch for Processing Plural RF Signals>>

Figure 5:
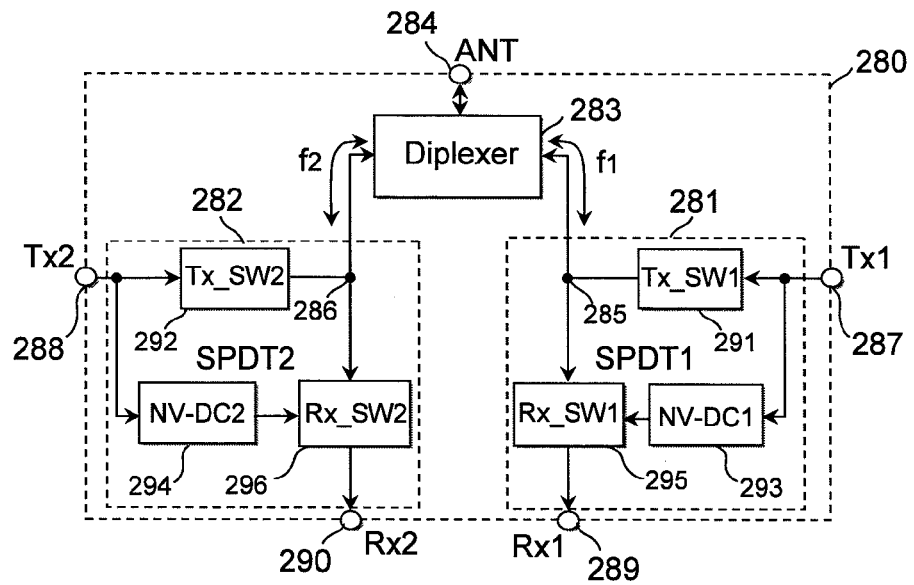
FIG. 5 is a diagram showing the configuration of a first SPDT-type antenna switch ANT-SW, a second SPDT-type antenna switch ANT-SW, and a diplexer provided in a semiconductor integrated circuit capable of processing a plurality of RF signals according to another embodiment of the invention.

FIG. 5 is a diagram showing the configuration of a first SPDT-type antenna switch ANT-SW 281, a second SPDT-type antenna switch ANT-SW 282, and a diplexer 283 provided in a semiconductor integrated circuit 280 capable of processing a plurality of RF signals according to another embodiment of the invention. The semiconductor integrated circuit 280 of FIG. 5 is also constructed as a monolithic microwave integrated circuit (MMIC) as a component of the antenna switch ANT-SW.

In the semiconductor integrated circuit 280 shown in FIG. 5, to enable a plurality of RF signals to be processed, the diplexer 283 is coupled to a common I/O port 284 coupled to the antenna ANT. The diplexer is a separator and a part for isolating one of a plurality of RF signals from the other RF signal when the antenna is shared by the RF signals. In FIG. 5, the diplexer 283 isolates between a first RF signal having a first frequency band f1 and a second RF signal having a second frequency band f2. Therefore, the diplexer as a separator includes a first filter having the first frequency band between the common I/O port coupled to the antenna and a first port and a second filter having the second frequency band between the common I/O port coupled to the antenna and a second port.

A duplexer as a separator for isolating a plurality of RF signals from each other in transmission/reception and the diplexer applied to the embodiment of the present invention are clearly distinguished from each other. In another embodiment of the present invention of FIG. 5, each of the first RF signal having the first frequency band f1 and the second RF signal having the second frequency band f2 isolated from each other by the diplexer 283 has to include a Tx signal and an Rx signal. Consequently, as the separator of the block 283, a diplexer is naturally used. Therefore, the diplexer 283 of the semiconductor integrated circuit 280 shown in FIG. 5 enables bidirection transmission of the first RF signal having the first frequency band f1 on the low frequency band side between the common I/O port 284 coupled to the antenna ANT and a first Rx port 285. Further, the diplexer 283 enables bidirection transmission of the second RF signal having the second frequency band f2 on the high frequency band side between the common I/O port 284 coupled to the antenna ANT and a second Rx port 286.

The first SPDT-type antenna switch ANT-SW 281 coupled to the first port of the diplexer 283 and controlling the bidirection transmission of the first RF signal having the first frequency band f1 has substantially the same configuration as that of the SPDT-type switch shown in FIG. 2. Specifically, the first SPDT-type antenna switch ANT-SW 281 shown in FIG. 5 includes a Tx switch 291, an Rx switch 295, and a DC boost circuit 293. In the first SPDT-type antenna switch ANT-SW 281 shown in FIG. 5, the Tx switch 291 has the same configuration as that of the Tx switch 101 in FIG. 2, the Rx switch 295 has the same configuration as that of the Rx switch 102 in FIG. 2, and the DC boost circuit 293 has the same configuration as that of the negative bias output of the DC boost circuit 100 in FIG. 2.

In the Rx mode of the first RF signal having the first frequency band f1, the Tx DC control bias supplied to the Tx DC control port of the Tx switch 291 is set to zero volt of the low level. The Rx DC control bias supplied to the Rx DC control port of the Rx switch 295 becomes three volts of the high level. Therefore, the FET of the Tx switch 291 coupled between the Tx port 287 and the first Rx port 285 is controlled to be off. On the other hand, the FET of the Rx switch 295 coupled between the Rx port 289 and the first Rx port 285 is controlled to be on.

In the Tx mode of the first RF signal having the first frequency band f1, the Tx DC control bias supplied to the Tx DC control port of the Tx switch 291 is set to three volts of the high level. The Rx DC control bias supplied to the Rx DC control port of the Rx switch 295 is set to zero volt of the low level. Therefore, the FET of the Tx switch 291 coupled between the Tx port 287 and the first Rx port 285 is controlled to be on. On the other hand, the FET of the Rx switch 295 coupled between the Rx port 289 and the first Rx port 285 is controlled to be off. Further, a negative bias output signal is generated from the output port of the DC boost circuit 293 in response to the RF transmission input signal Tx1 as an output of the Tx circuit supplied to the Tx port 287. The negative bias output signal is supplied to the FET of the Rx switch 295. As a result, the FET of the Rx switch 295 is reversely biased, and isolation of the FET of the Rx switch 295 is improved.

The second SPDT-type antenna switch ANT-SW 282 coupled to the second port of the diplexer 283 and controlling the bidirection transmission of the second RF signal having the second frequency band f2 has substantially the same configuration as that of the SPDT-type switch shown in FIG. 2. Specifically, the second SPDT-type antenna switch ANT-SW 282 shown in FIG. 5 includes a Tx switch 292, an Rx switch 296, and a DC boost circuit 294. In the second SPDT-type antenna switch ANT-SW 282 shown in FIG. 5, the Tx switch 292 has the same configuration as that of the Tx switch 101 in FIG. 2, the Rx switch 296 has the same configuration as that of the Rx switch 102 in FIG. 2, and the DC boost circuit 294 has the same configuration as that of the negative bias output of the DC boost circuit 100 in FIG. 2.

In the Rx mode of the second RF signal having the second frequency band f2, the Tx DC control bias supplied to the Tx DC control port of the Tx switch 292 is set to zero volt of the low level. The Rx DC control bias supplied to the Rx DC control port of the Rx switch 296 is set to three volts of the high level. Therefore, the FET of the Tx switch 292 coupled between the Tx port 288 and the second Rx port 286 is controlled to be off. On the other hand, the FET of the Rx switch 296 coupled between the Rx port 290 and the second Rx port 286 is controlled to be on.

In the Tx mode of the second RF signal having the second frequency band f2, the Tx DC control bias supplied to the Tx DC control port of the Tx switch 292 is set to three volts of the high level. The Rx DC control bias supplied to the Rx DC control port of the Rx switch 296 is set to zero volt of the low level. Therefore, the FET of the Tx switch 292 coupled between the Tx port 288 and the second Rx port 286 is controlled to be on. On the other hand, the FET of the Rx switch 296 coupled between the Rx port 290 and the second Rx port 286 is controlled to be off. Further, a negative bias output signal is generated from the output port of the DC boost circuit 294 in response to the RF transmission input signal Tx2 as an output of the Tx circuit supplied to the Tx port 288. The negative bias output signal is supplied to the FET of the Rx switch 296. As a result, the FET of the Rx switch 296 is reversely biased, and isolation of the FET of the Rx switch 296 is improved.

In the Tx mode of the second RF signal having the second frequency band f2 in the second SPDT-type antenna switch ANT-SW 282, the RF Tx input signal Tx2 supplied to a Tx port 288 is supplied to the antenna ANT coupled to the common I/O port 284 via the FET of the Tx switch 292, the second Rx port 286, and the diplexer 283. However, at this time, by the function of the diplexer 283, a loss signal component of the RF Tx signal of the second frequency band f2 transmitted to the first Rx port 285 of the first SPDT-type antenna switch ANT-SW 281 is at an ignorable level. Therefore, even if the Tx switch 291 of the first SPDT-type antenna switch ANT-SW 281 is constructed by coupling of only the FET 211 of one stage as shown in the Tx switch 101 in FIG. 2, the loss signal component of the Tx switch 291 of the first SPDT-type antenna switch ANT-SW 281 of FIG. 5 can be set to an ignorable level.

Similarly, in the Tx mode of the first RF signal having the first frequency band f1 in the first SPDT-type antenna switch ANT-SW 281, the RF Tx input signal Tx1 supplied to a Tx port 287 is supplied to the antenna ANT coupled to the common I/O port 284 via the FET of the Tx switch 291, the first Rx port 285, and the diplexer 283. However, at this time, by the function of the diplexer 283, a loss signal component of the RF Tx signal Tx1 of the first frequency band f1 transmitted to the second Rx port 286 of the second SPDT-type antenna switch ANT-SW 282 is at an ignorable level. Therefore, even if the Tx switch 292 of the second SPDT-type antenna switch ANT-SW 282 is constructed by coupling of only the FET 211 of one stage as shown in the Tx switch 101 in FIG. 2, the loss signal component of the Tx switch 292 of the second SPDT-type antenna switch ANT-SW 282 of FIG. 5 can be set to an ignorable level.

FIG. 6 is a diagram showing the configuration of a first SP3T-type antenna switch ANT-SW 251, a second SP3T-type antenna switch ANT-SW 252, and a diplexer 253 provided in a semiconductor integrated circuit 250 capable of processing a number of RF signals according to another embodiment of the invention. The semiconductor integrated circuit 250 of FIG. 6 is also constructed as a monolithic microwave integrated circuit (MMIC) as a component of the antenna switch ANT-SW. SP3T is an abbreviation of Single Pole Triple Throw.

The diplexer 253 of the semiconductor integrated circuit 250 shown in FIG. 6 has functions similar to those of the diplexer 283 of the semiconductor integrated circuit 280 shown in FIG. 5.

The first SP3T-type antenna switch ANT-SW 251 of the semiconductor integrated circuit 250 shown in FIG. 6 includes a Tx switch 263, a common Rx switch 267, a DC boost circuit 265, a first Rx switch 269, and a second Rx switch 270. In the first SP3T-type antenna switch ANT-SW 251 shown in FIG. 6, the Tx switch 263 has the same configuration as that of the Tx switch 281 in FIG. 5, the common Rx switch 297 has the same configuration as that of the Rx switch 295 in FIG. 5, and the DC boost circuit 265 has the same configuration as that of the negative bias output of the DC boost circuit 293 in FIG. 5. Further, in the first SP3T-type antenna switch ANT-SW 251 shown in FIG. 6, the first and second Rx switches 269 and 270 coupled to the common Rx switch 267 include FETs to which RF Rx signals Rx11 and Rx12 of Rx ports 259 and 260 are supplied, respectively. Therefore, the first SP3T-type antenna switch ANT-SW 251 shown in FIG. 6 uses a first Rx port 255 as a single pole, and uses a first Tx port 257 and the first and second Rx ports 259 and 260 as triple throw. In the Tx mode of the RF Tx input signal Tx1 supplied to the Tx port 257, a negative bias output signal is generated from the output port of the DC boost circuit 263 in response to the RF Tx signal and is supplied to the FET in the common Rx switch 267. As a result, the FET of the common Rx switch 267 is reversely biased, and isolation of the FET of the common Rx switch 267 is improved.

Further, the second SP3T-type antenna switch ANT-SW 252 of the semiconductor integrated circuit 250 shown in FIG. 6 includes a Tx switch 264, a common Rx switch 268, a DC boost circuit 266, a first Rx switch 271, and a second Rx switch 272. In the second SP3T-type antenna switch ANT-SW 252 shown in FIG. 6, the Tx switch 264 has the same configuration as that of the Tx switch 282 in FIG. 5, the common Rx switch 268 has the same configuration as that of the Rx switch 296 in FIG. 5, and the DC boost circuit 266 has the same configuration as that of the negative bias output of the DC boost circuit 294 in FIG. 5. Further, in the second SP3T-type antenna switch ANT-SW 252 shown in FIG. 6, the first and second Rx switches 271 and 272 coupled to the common Rx switch 268 include FETs to which RF Rx signals Rx21 and Rx12 of Rx ports 261 and 262 are supplied, respectively. Therefore, the second SP3T-type antenna switch ANT-SW 252 shown in FIG. 6 uses a first Rx port 256 as a single pole, and uses a second Tx port 258, and the first and second Rx ports 261 and 262 as triple throw. In the Tx mode of the RF Tx input signal Tx2 supplied to the Tx port 258, a negative bias output signal is generated from the output port of the DC boost circuit 266 in response to the RF Tx signal Tx1 and is supplied to the FET in the common Rx switch 268. As a result, the FET of the common Rx switch 268 is reversely biased, and isolation of the FET of the common Rx switch 268 is improved.

<<MMIC Including SPDT-Type Antenna Switch ANT-SW>>

FIG. 7 is a diagram showing the configuration of a monolithic microwave integrated circuit (MMIC) 700 capable of processing a plurality of RF signals and having therein a first SPDT-type antenna switch ANT-SW SPDT1 and a second SPDT-type antenna switch ANT-SW SPDT2 according to another embodiment of the invention.

The first SPDT-type antenna switch ANT-SW SPDT1 and the second SPDT-type antenna switch ANT-SW SPDT2 built in the MMIC 700 shown in FIG. 7 have the same functions as those of the first SPDT-type antenna switch ANT-SW 281 and the second SPDT-type antenna switch ANT-SW 282 built in the semiconductor integrated circuit 280 shown in FIG. 5. Between a first Rx port 701 of the first SPDT-type antenna switch ANT-SW SPDT1 and the diplexer 283, bidirection transmission of the first RF signal having the first frequency band f1 on the low frequency band side is enabled. Further, between a second Rx port 702 of the second SPDT-type antenna switch ANT-SW SPDT2 and the diplexer 283, bidirection transmission of the second RF signal having the second frequency band f2 on the high frequency band side is enabled.

Specifically, a Tx switch 705 (Tx_SW1), an Rx switch (Rx_SW1) 703, and a DC boost circuit (NV-DC1) 730 included in the first SPDT-type antenna switch ANT-SW SPDT1 of FIG. 7 have the same functions as those of the Tx switch 291, the Rx switch 295, and the DC boost circuit 293 included in the first SPDT-type antenna switch ANT-SW 281 in FIG. 5, respectively.

A Tx switch 706 (Tx_SW2), an Rx switch (Rx_SW2) 704, and a DC boost circuit (NV-DC2) 750 included in the second SPDT-type antenna switch ANT-SW SPDT2 of FIG. 7 have the same functions as those of the Tx switch 292, the Rx switch 296, and the DC boost circuit 294 included in the second SPDT-type antenna switch ANT-SW 282 in FIG. 5, respectively.

<<MMIC Including SP3T-Type Antenna Switch ANT-SW>>

Figure 8:
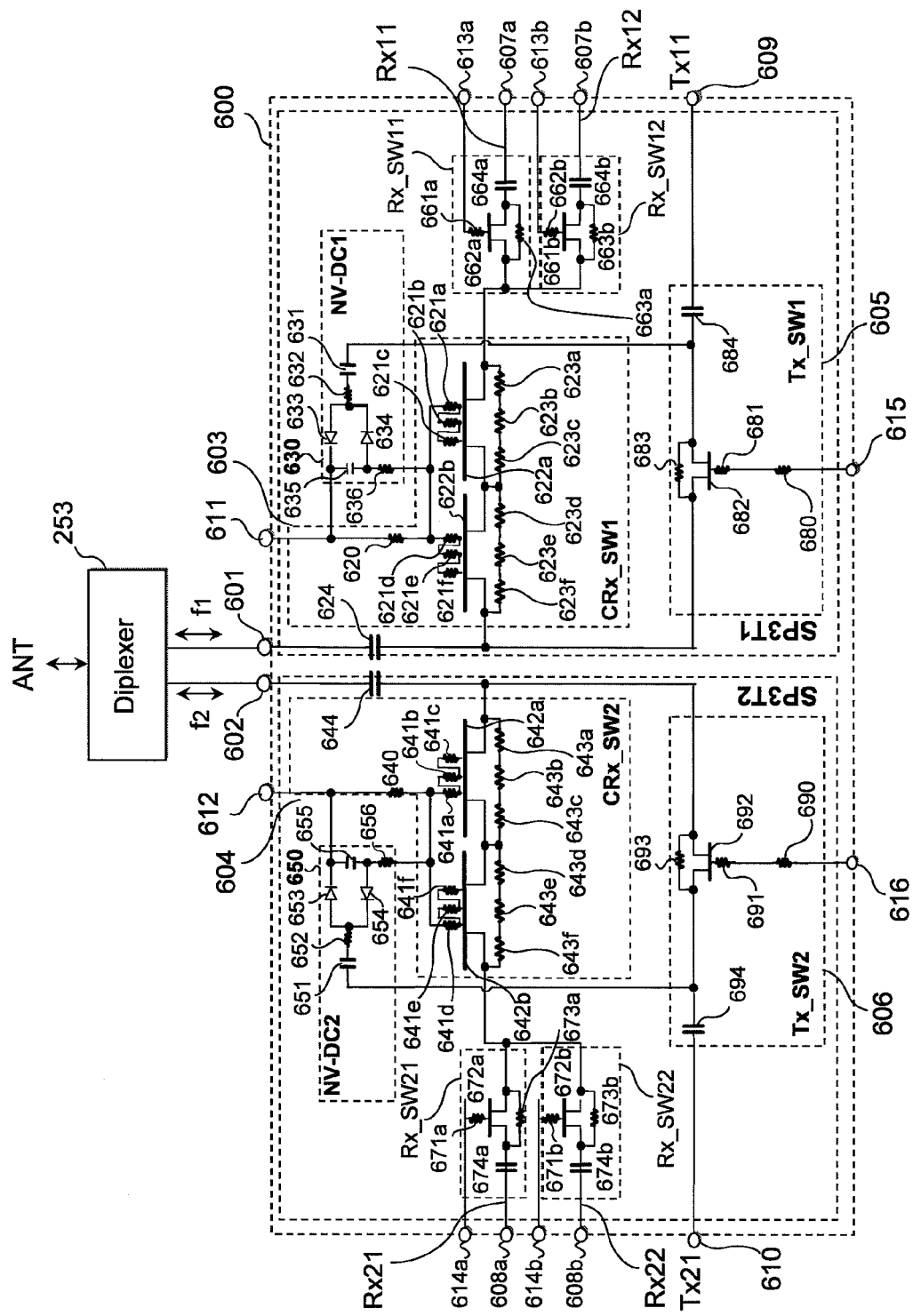
FIG. 8 is a diagram showing the configuration of a monolithic microwave integrated circuit MMIC capable of processing a plurality of RF signals and having therein a first SP3T-type antenna switch ANT-SW and a second SP3T-type antenna switch ANT-SW according to another embodiment of the invention.

FIG. 8 is a diagram showing the configuration of a monolithic microwave integrated circuit (MMIC) capable of processing a plurality of RF signals and having therein a first SP3T-type antenna switch ANT-SW SP3T1 and a second SP3T-type antenna switch ANT-SW SP3T2 according to another embodiment of the invention.

The first SP3T-type antenna switch ANT-SW SP3T1 and the second SP3T-type antenna switch ANT-SW SP3T2 built in the MMIC 600 shown in FIG. 8 have the same functions as those of the first SP3T-type antenna switch ANT-SW 251 and the second SP3T-type antenna switch ANT-SW 252 built in the semiconductor integrated circuit 250 shown in FIG. 6. Between a first Rx port 601 of the first SP3T-type antenna switch ANT-SW SP3T1 and the diplexer 253, bidirection transmission of the first RF signal having the first frequency band f1 on the low frequency band side is enabled. Further, between a second Rx port 602 of the second SP3T-type antenna switch ANT-SW SP3T2 and the diplexer 253, bidirection transmission of the second RF signal having the second frequency band f2 on the high frequency band side is enabled.

Specifically, a Tx switch 605 (Tx_SW1), a common Rx switch (CRx_SW1) 603, a DC boost circuit (NV-DC1) 630, a first Rx switch Rx_SW11, and a second Rx switch Rx_SW12 included in the first SP3T-type antenna switch ANT-SW SP3T1 of FIG. 8 have the same functions as those of the Tx switch 263, the common Rx switch 267, the DC boost circuit 265, the first Rx switch 269, and the second Rx switch 270 included in the first SP3T-type antenna switch ANT-SW 251 in FIG. 6, respectively. In the first SP3T-type antenna switch ANT-SW SP3T1 in FIG. 8, the first Rx switch Rx_SW11 is constructed by an FET 662*a*, resistances 661*a* and 663*a*, and a capacitance 664*a*, and the second Rx switch Rx_SW12 is constructed by an FET 662*b*, resistances 661*b* and 663*b*, and a capacitance 664*b*.

A Tx switch 606 (Tx_SW2), a common Rx switch (CRx_SW2) 604, a DC boost circuit (NV-DC2) 650, a first Rx switch Rx_SW21, and a second Rx switch Rx_SW22 included in the second SP3T-type antenna switch ANT-SW SP3T2 of FIG. 8 have the same functions as those of the Tx switch 264, the common Rx switch 268, the DC boost circuit 266, the first Rx switch 271, and the second Rx switch 272 included in the second SP3T-type antenna switch ANT-SW 252 in FIG. 6, respectively. In the second SP3T-type antenna switch ANT-SW SP3T2 in FIG. 8, the first Rx switch Rx_SW21 is constructed by an FET 672*a*, resistances 671*a* and 673*a*, and a capacitance 674*a*, and the second Rx switch Rx_SW22 is constructed by an FET 672*b*, resistances 671*b* and 673*b*, and a capacitance 674*b*.

Figure 9:
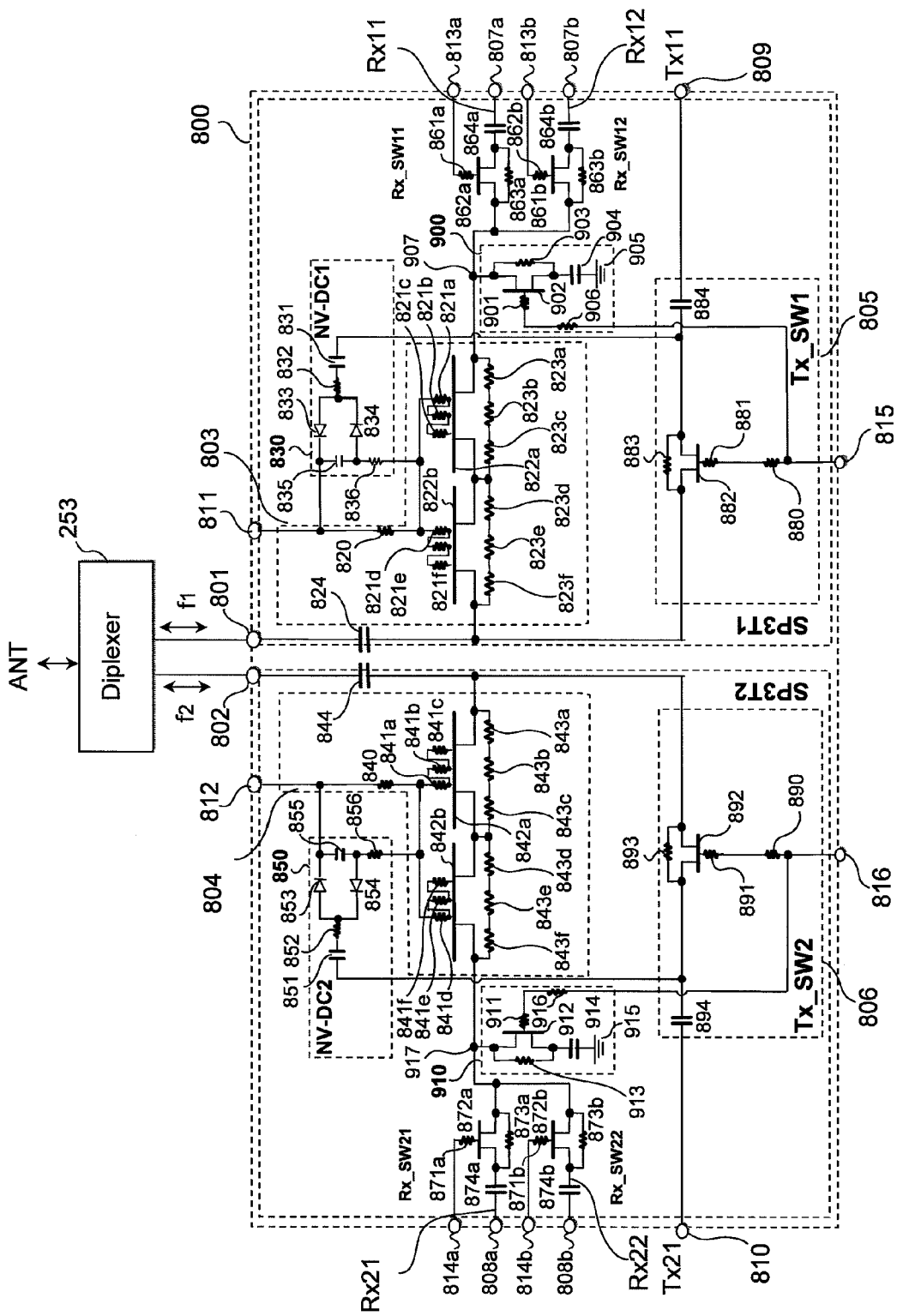
FIG. 9 is a diagram showing the configuration of a monolithic microwave integrated circuit MMIC capable of processing a plurality of RF signals and having therein a first SP3T-type antenna switch ANT-SW and a second SP3T-type antenna switch ANT-SW according to another embodiment of the invention.

FIG. 9 is a diagram showing the configuration of a monolithic microwave integrated circuit (MMIC) 800 capable of processing a plurality of RF signals and having therein a first SP3T-type antenna switch ANT-SW SP3T1 and a second SP3T-type antenna switch ANT-SW SP3T2 according to another embodiment of the invention.

The reference numerals for the internal circuits of the MMIC 800 shown in FIG. 9 are in the order of 800, and those for the internal circuits of the MMIC 600 shown in FIG. 8 are in the order of 600. The basic configuration and the basic operation of the MMIC 800 shown in FIG. 9 are the same as those of the MMIC 600 shown in FIG. 8.

However, in comparison with the MMIC 600 shown in FIG. 8, the MMIC 800 shown in FIG. 9 is added with a first shunt switch circuit 900 and a second shunt switch circuit 910.

In the first SP3T-type antenna switch ANT-SW SP3T1 of the MMIC 800 of FIG. 9, the first shunt switch circuit 900 is coupled between a common Rx switch (CRx_SW1) 803 and the first and second Rx switches Rx_SW11 and Rx_SW12. The first shunt switch circuit 900 includes an FET 902, resistances 901, 903, and 906, and a capacitance 904. In the Tx mode of transmitting the RF Tx signal Tx1 supplied to the first Tx port 809 in the first SP3T-type antenna switch ANT-SW SP3T1, in response to the first Tx DC control bias of the high level supplied to the first Tx DC control port 815, the FET 882 of the Tx switch 805 (Tx_SW1) is controlled to be on. Simultaneously, in response to a first Tx DC control bias of the high level supplied to the first Tx DC control port 815, the FET 882 of the Tx switch 805 (Tx_SW1) is controlled to be on, the FET 902 in the first shunt switch circuit 900 is also controlled to be on. Therefore, since the impedance between an Rx input node 907 of the first and second Rx switches Rx_switch Rx_SW11 and Rx_SW12 is set to low, a loss signal component transmitted to the Rx input node 907 in the Tx mode of the RF Tx signal Tx1 can be effectively bypassed to a ground potential 905.

Further, in the second SP3T-type antenna switch ANT-SW SP3T2 of the MMIC 800 of FIG. 9, the second shunt switch circuit 910 is coupled between a common Rx switch (CRx_SW2) 804 and the first and second Rx switches Rx_SW21 and Rx_SW22. The second shunt switch circuit 910 includes an FET 912, resistances 911, 913, and 916, and the capacitance 914. In the Tx mode of transmitting the RF Tx signal Tx2 supplied to the second Tx port 810 in the second SP3T-type antenna switch ANT-SW SP3T2, in response to the second Tx DC control bias of the high level supplied to the second Tx DC control bias 816, the FET 892 of the Tx switch 806 (Tx_SW2) is controlled to be on. Simultaneously, in response to the second Tx DC control bias of the high level supplied to the second Tx DC control port 816, the FET 912 in the second shunt switch circuit 910 is also controlled to be on. Therefore, since the impedance between an Rx input node 917 of the first and second Rx switches Rx_switch Rx_SW21 and Rx_SW22 is set to low, a loss signal component transmitted to the Rx input node 917 in the Tx mode of the RF Tx signal Tx2 can be effectively bypassed to a ground potential <<RF Module>>

FIG. 10 is a diagram showing the configuration of an RF module RF_ML including an antenna switch ANT-SW constructed in a monolithic microwave integrated circuit MMIC capable of processing a plurality of RF signals according to another embodiment of the invention.

The RF module RF_ML shown in FIG. 10 includes an HPA module HPA_ML and an RF analog signal processing semiconductor integrated circuit RF-IC. The RF analog signal processing semiconductor integrated circuit RF-IC is coupled to a baseband signal processing unit BB_LSI. The HPA module HPA_ML includes a power amplifier (HPA) PA_ML and an antenna switch ANT-SW. The HPA PA_ML is coupled to an RF semiconductor integrated circuit RF_IC, and the antenna switch ANT_SW is coupled to the antenna ANT mounted on a cellular phone terminal via a diplexer.

A control unit included in the HPA PA_ML is formed by a CMOS manufacturing process on a silicon chip of a semiconductor integrated circuit. A low-band-side RF power amplifier (HPA) HPA1 and a high-band-side RF power amplifier (HPA) HPA2 included in the HPA PA_ML include power MOS transistors of the LD (Laterally Diffused) structure formed by the CMOS manufacturing process in the silicon chip in which the control unit is formed.

The antenna switch ANT_SW of the HPA module HPA_ML includes two SPDT-type antenna switches ANT- SW according to the embodiment described in FIG. 5 or 7. Therefore, the antenna switch ANT_SW shown in FIG. 10 is constructed on a compound semiconductor chip made of GaAs or the like, and includes an HEMT transistor functioning as an RF switch, an MIM (Metal-Insulator-Metal) capacitor functioning as a capacitance, and a mesa resistance functioning as a resistance.

A baseband signal processing unit BB_LSI is coupled to a nonvolatile memory (not shown) and an application processor (not shown). The application processor is coupled to a liquid crystal device (not shown) and a keyboard input device (not shown) and can execute various application programs including a general program and a game. A boot program (initialize program) of a mobile device such as a cellular phone, an operating system program (OS), a program for phase demodulation on an Rx baseband signal of a GSM (Global System for Mobile Communication) system or the like by a digital signal processor (DSP) in a baseband signal processing LSI and phase modulation on a Tx baseband signal, and various application programs can be stored in an external nonvolatile memory.

In an Rx mode of a cellular phone terminal, an Rx signal RX from a base station received by an antenna ANT is supplied to the common I/O port of a diplexer.

In the case where the RF Rx signal RX has a high frequency band of about 1,805 MHz to about 1,990 MHz, the RX signal RX having the high frequency band is supplied to a high-band-side I/O port I/O_HB of the antenna switch ANT_SW, and a high-band-side Rx port RX2. A high-band-side RF Rx signal from the high-band-side Rx port RX2 is supplied to the RF analog signal processing semiconductor integrated circuit RF_IC via a surface acoustic wave filter SAW2 on the high-band side. The high-band-side RF Rx signal HB_Rx from the high-band surface acoustic wave filter SAW2 is amplified by a high-band-side low noise amplifier LNA 2. The high-band-side RF Rx signal HB_Rx from the high-band surface acoustic wave filter SAW2 is amplified by a high-band-side low noise amplifier LNA 2. The RF Rx signal of the high-band-side low-noise amplifier LNA2 is converted to an Rx baseband signal by RF down conversion of an Rx signal processing unit Rx_SPU. The Rx baseband signal is converted to a digital Rx baseband signal Rx_BBS by an A/D converter included in a digital interface in the semiconductor integrated circuit RF_IC and supplied to the baseband signal processing unit BB_LSI.

In the case where the RF Rx signal RX has a low frequency band of about 869 MHz to about 950 MHz, the RF Rx signal RX having the low frequency band is supplied to a low-band-side I/O port I/O_LB of the antenna switch ANT_SW, and a low-band-side Rx port RX1. A low-band-side RF Rx signal from the low-band-side Rx port RX1 is supplied to the RF analog signal processing semiconductor integrated circuit RF_IC via a surface acoustic wave filter SAW1 on the low-band side. The low-band-side RF Rx signal LB_Rx from the low-band surface acoustic wave filter SAW1 is amplified by a low-band-side low noise amplifier LNA1. An RF Rx signal of the low-band-side low-noise amplifier LNA1 is converted to a Tx baseband signal by RF down conversion of the Rx signal processing unit Rx_SPU. The Tx baseband signal is converted to a digital Rx baseband signal Rx_BBS by an A/D converter included in a digital interface in the RF analog signal processing semiconductor integrated circuit RF_IC and supplied to the baseband signal processing unit BB_LSI.

In a Tx mode of a cellular phone terminal, a digital Tx baseband signal Tx_BBS generated from the baseband signal processing unit BB_LSI is converted to an analog Tx baseband signal by a D/A converter included in a digital interface in an RF analog signal processing semiconductor integrated circuit RF_IC. The analog Tx baseband signal is converted to an RF Tx signal by RF up conversion of a Tx signal processing unit Tx_SPU of the RF analog signal processing semiconductor integrated circuit RF_IC.

In the case where the RF Tx signal has a low frequency band of about 824 MHz to about 915 MHz, the RF Tx signal LB_Tx having the low frequency band is amplified by the low-band-side RF power amplifier HPA1 included in the HPA PA_ML. The low-band-side RF Tx signal from the low-band-side power amplifier HPA1 is supplied to the low-band-side output port TX1 of the antenna switch ANT_SW and a low-band-side I/O port I/O_LB of the antenna switch ANT_SW via a high pass filter HPF1 and a low pass filter LPF1. A low-band-side RF Tx output signal supplied to the low-band-side I/O port I/O_LB is transmitted as an Rx Tx signal TX to the base station via a diplexer and the antenna ANT.

In the case where the RF Tx signal TX has a high frequency band of about 1,710 MHz to about 1,910 MHz, the RF Tx signal HB_Tx having the high frequency band is amplified by a high-band-side RF power amplifier HPA2 included in the power amplifier PA_ML. The high-band-side RF Tx signal from the high-band-side power amplifier HPA2 is supplied to the high-band-side output port TX2 of the antenna switch ANT_SW and a high-band-side I/O port I/O_HB of the antenna switch ANT_SW via a high pass filter HPF2 and a low pass filter LPF2. A high-band-side RF Tx output signal supplied to the high-band-side I/O port I/O_HB is transmitted as an RF Tx signal TX to the base station via a diplexer and the antenna ANT.

On the other hand, a control signal BB_Cnt generated from the baseband signal processing unit BB_LSI is supplied to the control unit of the RF module RF_ML via the RF analog signal processing semiconductor integrated circuit RF_IC. From the control unit, transmit/receive control signals for switching the transmitting/receiving operation of two SPDT-type antenna switches ANT-SW included in the antenna switch ANT_SW are generated as shown by two dotted lines.

Further, the low-band-side RF Tx output signal of the RF power amplifier HPA1 on the low band side of the output port of the low pass filter LPF1 and the high-band-side RF Tx output signal of the high-band-side RF power amplifier HPA2 of the output port of the high-pass filter LPF2 are supplied to the input port of a high-pass filter HPF3 and the input port of a high-pass filter HPF4. Since the output port of the high pass filter HPF3 and that of the high pass filter HPF4 are coupled to the input of a power detector DET, a signal level of the low-band-side RF Tx output signal or a signal level of the high-band-side RF Tx output signal is generated from the output of the power detector DET. The power signal level of the output port of the power detector DET is supplied to the control unit, and the gain of the low-band-side RF power amplifier HPA1 and that of the high-band-side RF power amplifier HPA2 is controlled by the bias voltage generated from the control unit.

Figure 11:
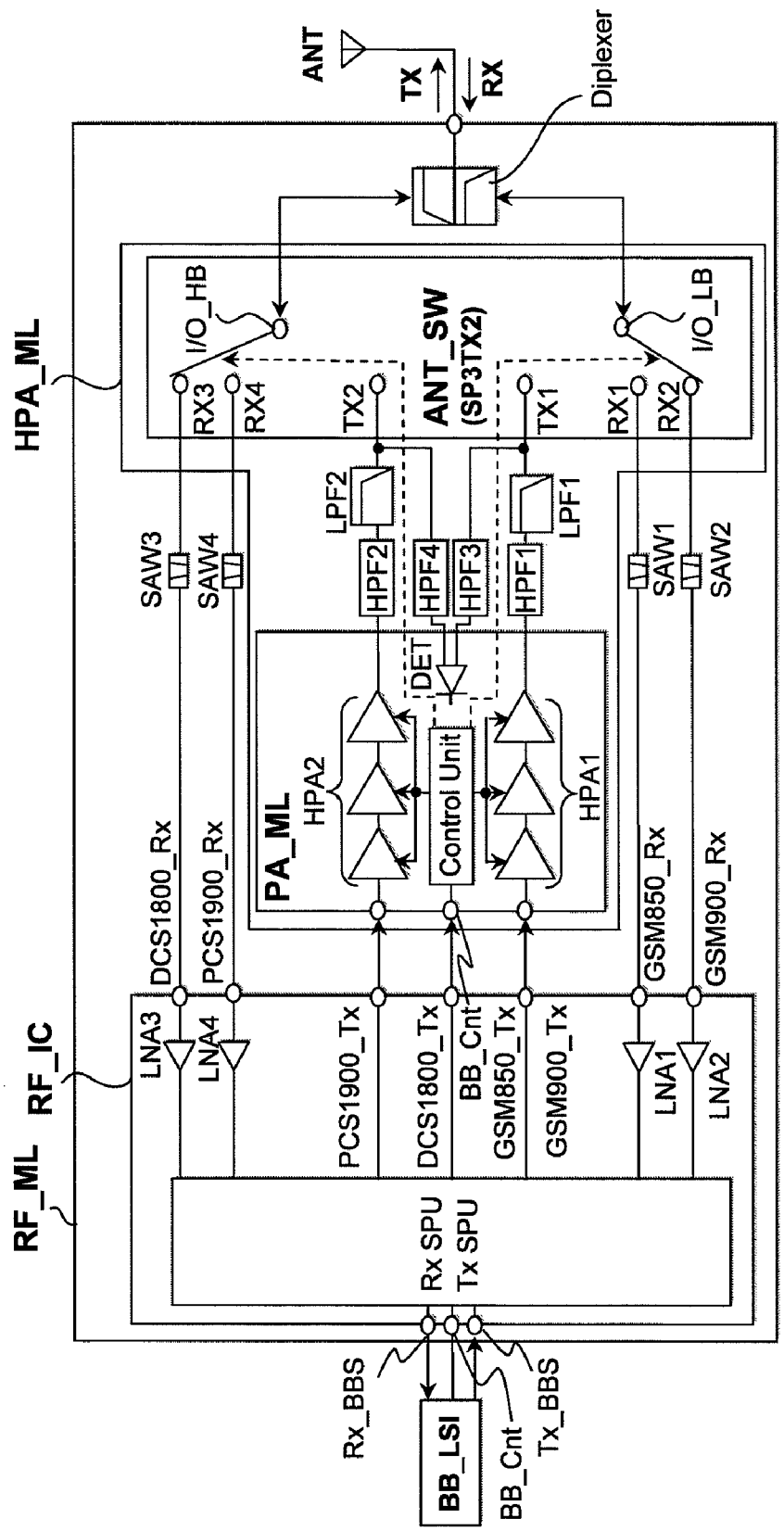
FIG. 11 is a diagram showing the configuration of an RF module including an antenna switch ANT-SW constructed in a monolithic microwave integrated circuit MMIC capable of processing a plurality of RF signals according to further another embodiment of the invention.
Figure 12A:
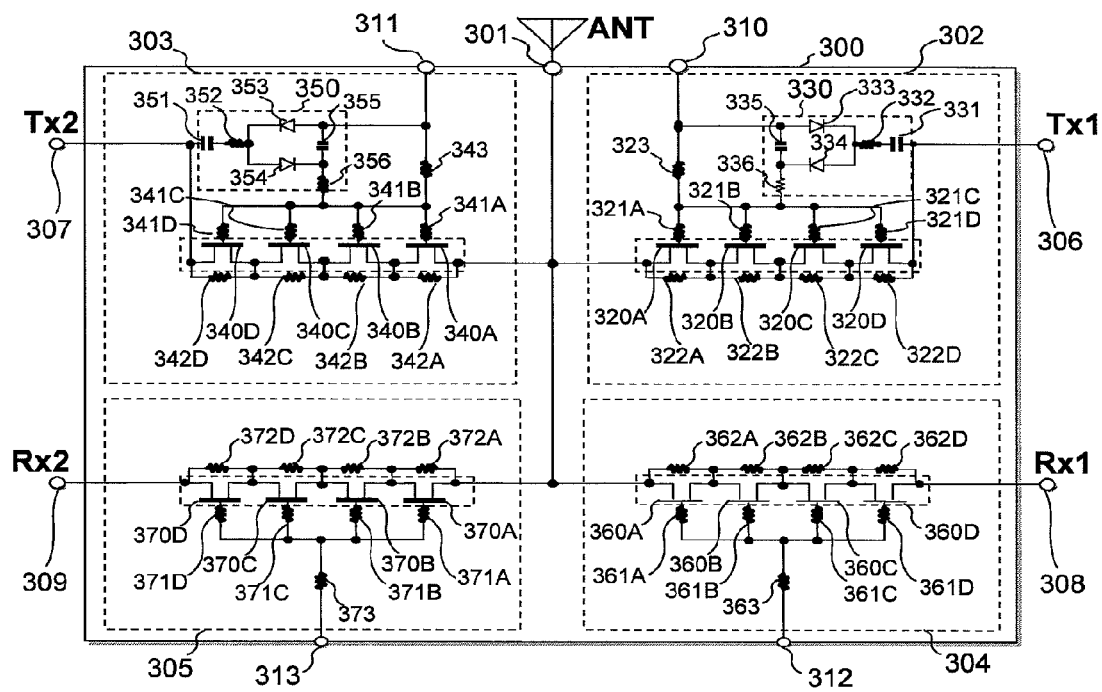
FIGS. 12A and 12B are diagrams showing an antenna switch ANT-SW and a DC boost circuit described in patent document 3.
Figure 12B:
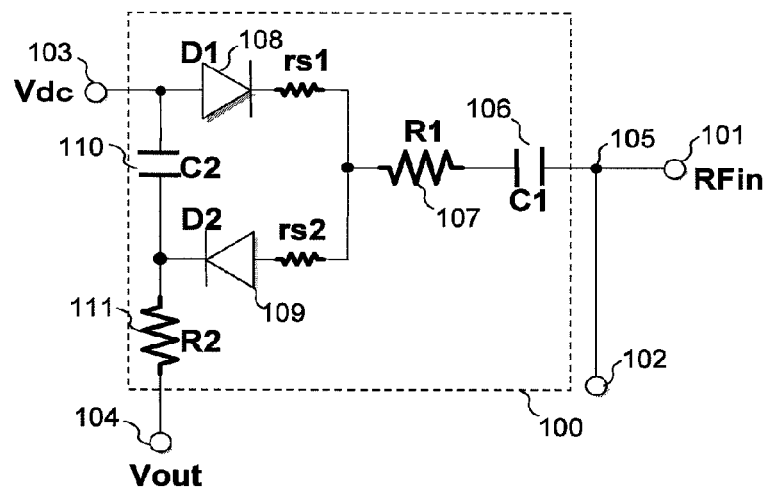
Figure 13A:
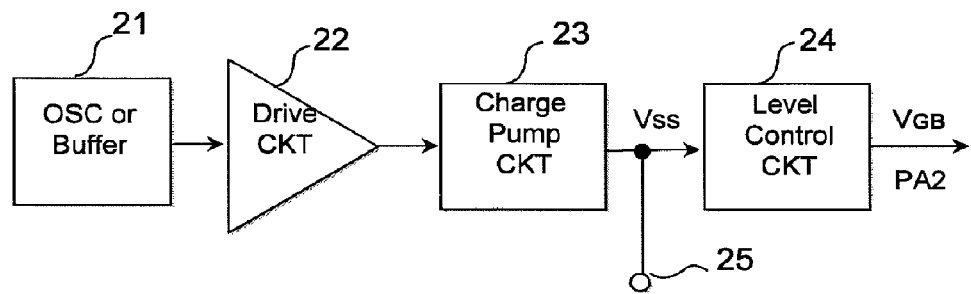
FIGS. 13A and 13B are diagrams showing an antenna switch ANT-SW, a control circuit, and a negative bias generation circuit described in patent document 1.
Figure 13B:
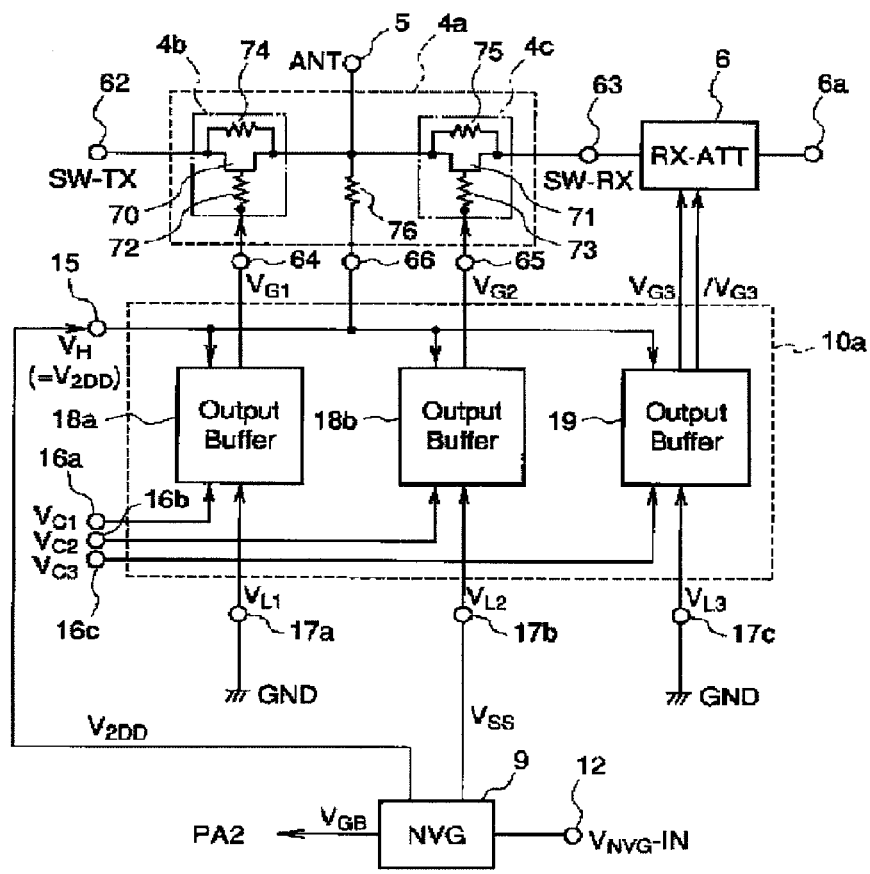

FIG. 11 is a diagram showing the configuration of an RF module RF_ML including an antenna switch ANT-SW constructed in a monolithic microwave integrated circuit MMIC capable of processing a plurality of RF signals according to further another embodiment of the invention.

The RF module RF_ML shown in FIG. 11 has therein, like the RF module RF_ML shown in FIG. 10, a high-power amplifier module HPA_ML and an RF analog signal processing semiconductor integrated circuit RF_IC. The RF analog signal processing semiconductor integrated circuit RF_IC is coupled to the baseband signal processing unit BB_LSI. The high-power amplifier HPA module HPA_ML includes a power amplifier HPAPA_ML and an antenna switch ANT_SW. The power amplifier PA_ML is coupled to the RF analog signal processing semiconductor integrated circuit RF_IC. The antenna switch ANT_SW is coupled to the antenna ANT mounted on a cellular phone terminal via the diplelxer.

The antenna switch ANT_SW of the HPA module HPA_ML includes two SP3T-type antenna switches ANT-SW according to the embodiment described with reference to FIGS. 6, 8, and 9.

A control unit included in the HPA PA_ML is formed by a CMOS manufacturing process on a silicon chip of a semiconductor integrated circuit. A low-band-side RF power amplifier (HPA) HPA1 and a high-band-side RF power amplifier (HPA) HPA2 included in the HPA PA_ML include power MOS transistors of the LD structure formed by the CMOS manufacturing process in the silicon chip in which the control unit is formed.

The antenna switch ANT_SW of the HPA module HPA_ML includes two SP3T-type antenna switches ANT-SW according to the embodiment described in FIG. 6, 8 or 9. Therefore, the antenna switch ANT_SW shown in FIG. 11 is constructed on a compound semiconductor chip made of GaAs or the like, and includes an HEMT transistor functioning as an RF switch, an MIM capacitor functioning as a capacitance, and a mesa resistance functioning as a resistance.

In the Rx mode of a cellular phone terminal, an Rx signal RX from a base station received by an antenna ANT is supplied to the common I/O port of a diplexer.

In the case where the RF Rx signal RX has a frequency band of a DCS (Digital Cellular System) of about 1,805 MHz to about 1,850 MHz, the RF Rx signal RX having the DCS frequency band is supplied to a high-band-side I/O port I/O_HB of the antenna switch ANT_SW, and a DCS Rx port RX3. A DCS RF Rx signal from the DCS Rx port RX3 is supplied to the RF analog signal processing semiconductor integrated circuit RF_IC via a DCS surface acoustic wave filter SAW3. A DCS RF Rx signal DCS1800_Rx from the DCS surface acoustic wave filter SAW3 is amplified by a DCS low-noise amplifier LNA3. The RF Rx signal of the DCS low-noise amplifier 3 is converted to an Rx baseband signal by RF down conversion of the Rx signal processing unit Rx_SPU. The DCS Rx baseband signal is converted to a digital Rx baseband signal Rx_BBS by an A/D converter included in a digital interface in the RF analog signal processing semiconductor integrated circuit RF_IC, and supplied to the baseband signal processing unit BB_LSI.

In the case where the RF Rx signal RX has a frequency band of a PCS (Personal Communication System) of about 1,850 MHz to about 1,910 MHz, the RF Rx signal RX having the PCS frequency band is supplied to a high-band-side I/O port I/O_HB of the antenna switch ANT_SW, and a PCS Rx port RX4. A PCS RF Rx signal from the PCS Rx port RX4 is supplied to the RF analog signal processing semiconductor integrated circuit RF_IC via a PCS surface acoustic wave filter SAW4. The PCS RF Rx signal PCS1900_Rx from the PCS surface acoustic wave filter SAW4 is amplified by a PCS low-noise amplifier LNA4. An RF Rx signal of the PCS low-noise amplifier LNA4 is converted to an Rx baseband signal by frequency down conversion of the Rx signal processing unit Rx_SPU. The PCS Rx baseband signal is converted to a digital Rx baseband signal Rx_BBS by an A/D converter included in a digital interface in the RF analog signal processing semiconductor integrated circuit RF_IC and supplied to the baseband signal processing unit BB_LSI.

In the case where the RF Rx signal has a GSM 850 frequency band of about 869 MHz to about 894 MHz, the RF Rx signal RX having the GSM 850 frequency band is supplied to the low-band-side I/O port I/O_LB of the antenna switch ANT_SW and a GSM 850 Rx port RX1. A GSM 850 RF Rx signal from the GSM 850 Rx port RX1 is supplied to the RF analog signal processing semiconductor integrated circuit RF_IC via a GSM 850 surface acoustic wave filter SAW1. The GSM 850 RF Rx signal LB_Rx from the GSM 850 surface acoustic wave filter SAW1 is amplified by a GSM 850 low-noise amplifier LNA1. An RF Rx signal of the GSM 850 low-noise amplifier LNA1 is converted to an Rx baseband signal by RF down conversion of the Rx signal processing unit Rx_SPU. The Rx baseband signal is converted to a digital Rx baseband signal Rx_BBS by an A/D converter included in a digital interface in the RF analog signal processing semiconductor integrated circuit RF_IC. and supplied to the baseband signal processing unit BB_LSI.

In the case where the RF Rx signal RX has a GSM 900 frequency band of about 925 MHz to about 950 MHz, the RF Rx signal RX having the GSM 900 frequency band is supplied to the low-band-side I/O port I/O_LB of the antenna switch ANT_SW and a GSM 900 Rx port RX2. A GSM 900 RF Rx signal from the GSM 900 Rx port RX2 is supplied to the RF analog signal processing semiconductor integrated circuit RF_IC via a GSM 900 surface acoustic wave filter SAW2. The GSM 900 RF Rx signal LB_Rx from the GSM 900 surface acoustic wave filter SAW2 is amplified by a GSM 900 low-noise amplifier LNA 2. An RF Rx signal of the GSM 900 low-noise amplifier LNA 2 is converted to an Rx baseband signal by RF down conversion of an Rx signal processing unit Rx_SPU. The Rx baseband signal is converted to a digital Rx baseband signal Rx_BBS by an A/D converter included in a digital interface in the RF analog signal processing semiconductor integrated circuit RF_IC and supplied to the baseband signal processing unit BB_LSI.

In a Tx mode of a cellular phone terminal, a digital Tx baseband signal Tx_BBS generated from the baseband signal processing unit BB_LSI is converted to an analog Tx baseband signal by a D/A converter included in a digital interface in an RF analog signal processing semiconductor integrated circuit RF_IC. The analog Tx baseband signal is converted to an RF Tx signal by RF up conversion of a Tx signal processing unit Tx_SPU of the RF analog signal processing semiconductor integrated circuit RF_IC.

In the case where the RF Tx signal has a low frequency band of GSM 850 of about 824 MHz to about 849 MHz or GSM900 of about 889 MHz to about 915 MHz, the GSM850 RF Tx signal GSM850_Tx or GSM900 RF Tx signal GSM900_Tx having the low frequency band is amplified by the low-band-side RF power amplifier HPA1 included in the RF module RF_ML. The low-band-side RF Tx signal from the low-band-side power amplifier HPA1 is supplied to the low-band-side output port TX1 of the antenna switch ANT_SW and a low-band-side I/O port I/O_LB of the antenna switch ANT_SW via a high pass filter HPF1 and a low pass filter LPF1. A low-band-side RF Tx output signal supplied to the low-band-side I/O port I/O_LB is transmitted as an Rx Tx signal TX to the base station via a diplexer and the antenna ANT.

In the case where the RF Tx signal TX has a high frequency band of GSM850 of about 1,710 MHz to about 1,785 MHz or GSM900 of about 1,850 MHz to about 1,910 MHz, the RF Tx signal GSM850_Tx or GSM900_Tx having the high frequency band is amplified by a high-band-side RF power amplifier HPA2 included in the power amplifier PA_MLL. The high-band-side RF Tx signal from the high-band-side power amplifier HPA2 is supplied to the high-band-side output port TX2 of the antenna switch ANT_SW and a high-band-side I/O port I/O_HB of the antenna switch ANT_SW via a high pass filter HPF2 and a low pass filter LPF2. A high-band-side RF Tx output signal supplied to the high-band-side I/O port I/O_HB is transmitted as an RF Tx signal TX to the base station via a diplexer and the antenna ANT.

Although the present invention achieved by the inventors herein has been concretely described on the basis of the embodiments, obviously, the invention is not limited to the embodiments but may be variously changed without departing from the gist.

For example, a power transistor at the final stage in each of the low-band-side RF power amplifier HPA1 and the high-band-side RF power amplifier HPA2 included in the power amplifier PA_ML may be a hetero bipolar transistor (HBT) made of GaAs, InGaAs, or the like.

A compound semiconductor chip made of GaAs or the like on which an antenna switch ANT_SW is formed Although the baseband signal processing unit and the application processor are constructed by different semiconductor chips in the foregoing embodiments, in another mode, an integrated one chip obtained by integrating an application processor to a semiconductor chip of a baseband signal processor.

What is claimed is:

1. A semiconductor integrated circuit comprising:
   at least one antenna switch (ANT-SW) comprising a bias generation circuit, a transmitter (Tx) switch, and a receiver (Rx) switch,
   wherein the Tx switch is coupled between a transmitter (Tx) port and an I/O port, an on/off state of a Tx field effect transistor of the Tx switch is controlled according to a level of a Tx control bias supplied to a Tx control port,
   wherein the Rx switch is coupled between the I/O port and a receiver (Rx) port, an on/off state of an Rx field effect transistor of the Rx switch is controlled according to a level of an RX control bias supplied to an Rx control port,
   wherein a radio frequency (RF) signal input port of the bias generation circuit is coupled to the Tx port of the Tx switch,
   wherein a part of a radio frequency (RF) input signal supplied to the radio frequency (RF) signal input port is rectified by the bias generation circuit so that a negative DC output bias is generated from a DC output port of the bias generation circuit, and
   wherein the negative DC output bias generated from the DC output port of the bias generation circuit is supplied to a gate control port of the Rx field effect transistor of the Rx switch.

2. The semiconductor integrated circuit according to claim 1,
   wherein each of the Tx field effect transistor of the Tx switch and the Rx field effect transistor of the Rx switch is an n-channel device,
   wherein in response to supply of the Tx control bias of a high level to the Tx control port, the Tx field effect transistor of the Tx switch is controlled to be on, and
   wherein in response to supply of the Rx control bias of a high level to the Rx control port, the Rx field effect transistor of the Rx switch is controlled to be on.

3. The semiconductor integrated circuit according to claim 2,
   wherein in a Tx mode of transmitting an RF transmission (Tx) input signal supplied to the Tx port to the I/O port, the Tx control bias of the high level is supplied to the Tx control port, the Rx control bias of a low level is supplied to the Rx control port, and
   wherein in the Tx mode, the negative DC output bias generated from the DC output port of the bias generation circuit is supplied to the gate control port of the Rx field effect transistor of the Rx switch in response to the RF Tx input signal supplied to the Tx port.

4. The semiconductor integrated circuit according to claim 3,
   wherein a DC control bias supply port of the bias generation circuit is coupled to the Rx control port, and
   wherein in the Tx mode, the Rx control bias of the low level supplied to the Rx control port is supplied to the DC control bias supply port of the bias generation circuit.

5. The semiconductor integrated circuit according to claim 4,
   wherein the Rx field effect transistor of the Rx switch comprises a plurality of field effect transistors in which a drain-source path is coupled in series between the I/O port and the Rx port.

6. The semiconductor integrated circuit according to claim 4,
   wherein each of the Rx field effect transistor of the Rx switch and the Tx field effect transistor of the Tx switch is an HEMT comprising a heterojunction.

7. The semiconductor integrated circuit according to claim 6,
   wherein the antenna switch ANT-SW comprises a first antenna switch ANT-SW that controls transmission of a first RF signal of a first frequency band, and a second antenna switch ANT-SW that controls transmission of a second RF signal of a second frequency band,
   wherein first and second ports of a diplexer are coupled to an I/O port of the first antenna switch ANT-SW and an I/O port of the second antenna switch ANT-SW, respectively, and
   wherein an antenna is coupled to a common I/O port of the diplexer.

8. The semiconductor integrated circuit according to claim 7,
   wherein a Tx switch of the first antenna switch ANT-SW comprises a single first Tx field effect transistor coupled between a Tx port of the first antenna switch ANT-SW and the I/O port, and
   wherein a Tx switch of the second antenna switch ANT-SW comprises a single second Tx field effect transistor coupled between a Tx port of the second antenna switch ANT-SW and the I/O port.

9. The semiconductor integrated circuit according to claim 7,
   wherein each of a bias generation circuit of the first antenna switch ANT-SW and a bias generation circuit of the second antenna switch ANT-SW comprises a first diode, a second diode, a first resistance, a second resistance, a first capacitance, and a second capacitance,
   wherein in each of the bias generation circuits, one of ports of serial coupling between the first resistance and the first capacitance is coupled to the RF signal input port, and an anode of the first diode and a cathode of the second diode are coupled to the other port of the serial coupling, and
   wherein a cathode of the first diode and one port of the second capacitance are coupled to the DC control bias supply port, and an anode of the second diode and the other port of the second capacitance are coupled to the DC output port via the second resistance.

10. A high frequency module comprising:
an HPA (High Power Amplifier) and an antenna switch ANT-SW semiconductor integrated circuit,
wherein the HPA (High Power Amplifier) amplifies an RF transmission (Tx) signal generated from an RF analog signal processing semiconductor integrated circuit RF-IC,
wherein an RF Tx output signal generated from an output of the HPA is supplied to an antenna via the ANT-SW semiconductor integrated circuit,
wherein an RF Rx signal received by the antenna is supplied to the RF analog signal processing semiconductor integrated circuit RF-IC via the ANT-SW semiconductor integrated circuit,
wherein the ANT-SW semiconductor integrated circuit comprises at least one antenna switch ANT-SW comprising a bias generation circuit, a Tx switch, and an Rx switch,
wherein the Tx switch is coupled between a Tx port and an I/O port, an on/off state of a Tx field effect transistor of the Tx switch is controlled according to a level of a Tx control bias supplied to a Tx control port,
wherein an Rx switch is coupled between the I/O port and a receiver (Rx) port, an on/off state of an Rx field effect transistor of the Rx switch is controlled according to a level of an RX control bias supplied to an Rx control port,
wherein a radio frequency (RF) signal input port of the bias generation circuit is coupled to the Tx port of the Tx switch,
wherein a part of a radio frequency (RF) input signal supplied to the radio frequency (RF) signal input port is rectified by the bias generation circuit so that a negative DC output bias is generated from a DC output port of the bias generation circuit, and
wherein the negative DC output bias generated from the DC output port of the bias generation circuit is supplied to a gate control port of the Rx field effect transistor of the Rx switch.

11. The high frequency module according to claim 10,
wherein each of the Tx field effect transistor of the Tx switch and the Rx field effect transistor of the Rx switch is an n-channel device,
wherein in response to supply of the Tx control bias of a high level to the Tx control port, the Tx field effect transistor of the Tx switch is controlled to be on, and
wherein in response to supply of the Rx control bias of a high level to the Rx control port, the Rx field effect transistor of the Rx switch is controlled to be on.

12. The high frequency module according to claim 11,
wherein in a Tx mode of transmitting an RF transmission (Tx) input signal supplied to the Tx port to the I/O port, the Tx control bias of the high level is supplied to the Tx control port, the Rx control bias of a low level is supplied to the Rx control port, and
wherein in the Tx mode, a negative DC output bias generated from the DC output port of the bias generation circuit is supplied to a gate control port of the Rx field effect transistor of the Rx switch in response to the RF Tx input signal supplied to the Tx port.

13. The high frequency module according to claim 12,
wherein a DC control bias supply port of the bias generation circuit is coupled to the Rx control port, and
wherein in the Tx mode, the Rx control bias of the low level supplied to the Rx control port is supplied to the DC control bias supply port of the bias generation circuit.

14. The high frequency module according to claim 13,
wherein the Rx field effect transistor of the Rx switch comprises a plurality of field effect transistors in which a drain-source path is coupled in series between the I/O port and the Rx port.

15. The high frequency module according to claim 13,
wherein each of the Rx field effect transistor of the Rx switch and the Tx field effect transistor of the Tx switch is an HEMT comprising a heterojunction.

16. The high frequency module according to claim 15,
wherein the antenna switch ANT-SW comprises a first antenna switch ANT-SW that controls transmission of a first RF signal of a first frequency band, and a second antenna switch ANT-SW that controls transmission of a second RF signal of a second frequency band,
wherein first and second ports of a diplexer are coupled to an I/O port of the first antenna switch ANT-SW and an I/O port of the second antenna switch ANT-SW, respectively, and
wherein an antenna is coupled to a common I/O port of the diplexer.

17. The high frequency module according to claim 16,
wherein a Tx switch of the first antenna switch ANT-SW comprises a single first Tx field effect transistor coupled between a Tx port of the first antenna switch ANT-SW and the I/O port, and
wherein a Tx switch of the second antenna switch ANT-SW comprises a single second Tx field effect transistor coupled between a Tx port of the second antenna switch ANT-SW and the I/O port.

18. The high frequency module according to claim 16,
wherein each of a bias generation circuit of the first antenna switch ANT-SW and a bias generation circuit of the second antenna switch ANT-SW comprises a first diode, a second diode, a first resistance, a second resistance, a first capacitance, and a second capacitance,
wherein in each of the bias generation circuits, one of ports of serial coupling between the first resistance and the first capacitance is coupled to the RF signal input port, and an anode of the first diode and a cathode of the second diode are coupled to the other port of the serial coupling, and
wherein a cathode of the first diode and one port of the second capacitance are coupled to the DC control bias supply port, and an anode of the second diode and the other port of the second capacitance are coupled to the DC output port via the second resistance.

* * * * *